United States Patent
Hidehira

(10) Patent No.: US 6,856,152 B2
(45) Date of Patent: Feb. 15, 2005

(54) IMPEDANCE MEASURING DEVICE FOR PRINTED WIRING BOARD

(75) Inventor: Yorio Hidehira, Okayama (JP)

(73) Assignee: MicroCraft K.K., Okayama (JP)

( * ) Notice: Subject to any disclaimer, the term of this patent is extended or adjusted under 35 U.S.C. 154(b) by 0 days.

(21) Appl. No.: 10/358,858

(22) Filed: Feb. 5, 2003

(65) Prior Publication Data

US 2003/0117159 A1 Jun. 26, 2003

Related U.S. Application Data

(63) Continuation-in-part of application No. 09/578,878, filed on May 25, 2000, now Pat. No. 6,624,650.

(30) Foreign Application Priority Data

May 31, 1999 (JP) .......................................... H11-151939

(51) Int. Cl.[7] .............................................. G01R 31/02
(52) U.S. Cl. ...................................................... 324/754
(58) Field of Search ................................ 324/754, 758, 324/765

(56) References Cited

U.S. PATENT DOCUMENTS

| | | | | |
|---|---|---|---|---|
| 3,681,682 A | * | 8/1972 | Cox et al. .................... 324/546 |
| 4,731,577 A | * | 3/1988 | Logan ......................... 324/754 |
| 4,864,227 A | * | 9/1989 | Sato ............................ 324/758 |
| 4,929,893 A | * | 5/1990 | Sato et al. ................... 324/758 |
| 5,196,789 A | * | 3/1993 | Golden et al. .............. 324/761 |
| 5,315,237 A | * | 5/1994 | Iwakura et al. ............. 324/754 |
| 5,755,038 A | * | 5/1998 | McMurtry .................... 33/559 |
| 5,850,147 A | * | 12/1998 | Stowers et al. ............. 324/761 |
| 6,252,391 B1 | * | 6/2001 | McAllister et al. ........ 324/72.5 |
| 6,323,667 B1 | * | 11/2001 | Kazama ....................... 324/761 |
| 6,624,650 B1 | * | 9/2003 | Hidehira ...................... 324/765 |

FOREIGN PATENT DOCUMENTS

| | | | | |
|---|---|---|---|---|
| JP | 2001004659 | * | 1/2001 | ........... G01R/1/067 |
| JP | 2001255340 | * | 9/2001 | ........... G01R/1/067 |
| JP | 2001-281283 |   | 10/2001 | |

* cited by examiner

Primary Examiner—David Zarneke
Assistant Examiner—Jermele Hollington
(74) Attorney, Agent, or Firm—Kilpatrick Stockton LLP

(57) ABSTRACT

The present invention provides an impedance measuring device for a printed wiring board. The device include an appropriate probe unit to locate measuring points on the printed wiring board. The probe unit has a probe with contact styli to be contacted with the measurement points. The probe is moved to make an arrangement of the contact styli matching the pattern of the measurement points.

6 Claims, 25 Drawing Sheets

(a)

(b)

IMPEDANCE MEASURING DEVICE FOR PRINTED WIRING BOARD

CROSS-REFERENCE TO RELATED APPLICATION

This application is a continuation-in-part of application Ser. No. 09/578,878, filed May 25, 2000 now U.S. Pat. No. 6,624,650. This application is related to, and claims foreign priority benefits from Japanese patent application No. H11-151939, filed May 31, 1999. The contents of the priority documents are specifically incorporated by reference herein.

FIELD OF THE INVENTION

The invention pertains to a device that measures a characteristic impedance of a printed wiring circuit on a printed wiring board.

BACKGROUND OF THE INVENTION

A CPU clock frequency and an operation clock for CPU interaction with external devices recently has been remarkably increased so that a processing speed of a computer may be increased. With the speed increase of the operation clock, the performance requirement for the printed wiring board where a data signal runs also become demanding. By way of example, there is a requirement that the characteristic impedance between printed wiring circuits formed by signal conductors on the printed wiring board need to be matched and that the characteristic impedance and the impedance of the circuit load need to be matched. Without the match, a signal is partially reflected back to a signal source such that the signal transmitted to the load becomes so weak that the data may not be transmitted completely. This becomes more important with an increase of the frequency.

Thus, to maintain the quality of the printed wiring board, it will be important to measure the characteristic impedance of the printed wiring circuit. Conventionally, the characteristic impedance of the printed wiring circuit is measured manually using a coaxial probe.

The operation clocks of equipment connected to computers are expected to increase in speed further in the future. Along with this trend, the need to measure the characteristic impedance to assure the quality of the printed wiring board will increase significantly. Then, the conventional method of manually measuring the impedance of the printed wiring circuit using a coaxial probe may not be good enough. It will be necessary to automate this process.

Thus, it is efficient and desirable to move a probe unit by means of a testing device for the printed wiring board to measure impedance between testing points. Therefore, an object of the present invention is to provide an impedance measuring device for the automatic measurement of the characteristic impedance of the printed wiring circuit on the printed wiring board principally by loading a coaxial probe, or another type of the probe in the automatic printed wiring board testing device.

SUMMARY OF THE INVENTION

The present invention seeks to provide an impedance measuring device having a probe unit capable of locating measurement points on the printed wiring board with ease so that a plurality of contact styli or pins can be matched precisely with points to be measured.

According to the present invention, a probe unit for measuring impedance for a printed wiring board comprises a probe having a first and a second contact styli to be contacted with a first and a second predetermined points on the printed wiring board, where the styli are fixed to the probe with a resilient member; a turn disk having a turn center and a first position on a board-side face of the turn disk, where the probe is disposed at the first position; a turn device for turning the turn disk around the turn center such that the probe turns so that the contact styli turns substantially parallel to a measurement face of the printed wiring board; and a moving device for moving the probe toward the measurement face of the printed wiring board such that the first and second contact styli are contacted with the predetermined points. Here, the turn disk may have a second position at which the probe can be disposed by being shifted from the first position and the first position is farther from the turn center than the second position such that the probe is turned with a larger radius of curvature at the first position.

Here, the probe may include a coaxial probe, a multi-stylus probe with a plurality of contact styli or pins, and any other kinds of probes. The number of the styli or pins of the probe is not limited. It may be two, three, four, five, six, and so on. The turn disk according to the present invention may include any types or shapes of plates or blocks such as a circular disk, a rectangular plate, a dice-like block, and fragmental parts thereof. The turn disk may be a member that can hold the probe and turn around center. By way of example, a bar-like member may be a turn disk since the member may hold the probe and turn around the turn center which may fall near one end of the member. The member also may have another position for holding the probe from the first position. The resilient member may include a spring, an elastomer, and any other type of elastic and/or plastic member. The turn center may or may not coincide with one of the styli, especially at the top tip of the stylus. The probe may be a coaxial probe, or another type of probe. The predetermined point may be located at a flat conductive plate on the board. The turn device may include a servomotor, a stepping motor, an ultrasonic motor, and any other type of motor, and any kind of driving device such as an engine.

According to the present invention, the probe unit has the turn disk comprising a shift device shifting the probe from the first position to the so second position in a substantially continuous manner. The shift device may include any kind of device such as a servomotor, a stepping motor, an ultrasonic motor, a linear motor, and any other type of motor, and any kind of driving device such as an engine.

According to the present invention, the probe unit has the shift device comprising a shift rail between the first and the second position; and a probe moving device for moving the probe along the shift rail. The probe moving device or any other types of moving and/or turning and/or spinning devices mentioned later may include a servomotor, a stepping motor, a linear motor, any other type of motor, and any kind of driving device such as an engine. The shift rail may guide the probe when the probe is shifted.

According to the present invention, the probe unit has the turn disk comprising a shift device shifting the probe from the first position to the second position in such a substantially discontinuous manner that the probe becomes detached or apart from the turn disk at least once while the probe is shifted. The shift device may include a servomotor, a stepping motor, a linear motor, any other type of motor, and any kind of driving device such as an engine. The probe may be manually shifted. The shift device may also include any kind of tool such as a screw, a screw driver, a wrench and so on.

According to the present invention, the probe unit has the probe including a third contact stylus to be contacted with a third predetermined points on the printed wiring board. The third contact stylus is fixed to the probe with another resilient member. The third contact stylus may or may not coincide with the turn center. If it does, the other styli turn around the third contact stylus.

According to the present invention, at least one of the three styli can be fixed to another position on the probe by being shifted from an original position of the shifted stylus on the probe such that the shifted stylus can be contacted with another predetermined point on the printed wiring board. Thus, the stylus arrangement may be easily changed with the same number of styli. And it may be easier to match up with the pattern of measurement points to be contacted with the styli.

According to the present invention, the turn disk and the turn device are moved together by the moving device. The turn device comprises a motor causing a turning driving force; a belt transmitting the turning driving force; a pulley being connected to the turn disk and receiving the turning driving force from the belt such that the turn disk can be turned around the turn center; and a turn main body supporting the pulley rotatably with a bearing. The motor mentioned above may include a servomotor, a stepping motor, a linear motor, and any other type of motor. The belt may include a timing belt, a V-belt, and any other kind of belt.

According to the present invention, the probe unit includes the moving device comprising a second motor causing a second turning driving force; a second belt transmitting the second turning driving force; a ball screw having a second pulley receiving the second turning driving force from the second belt; and a mount member on which the turn main body is mounted. The second motor mentioned above may include a servomotor, a stepping motor, a linear motor, and any other type of motor. The second belt may include a timing belt, a V-belt, and any other kind of belt. The mount member may include a connecting block which may be linearly moved by the ball screw.

According to the present invention, the impedance measuring device for a printed wiring board includes the probe unit aforementioned; a probe unit moving device for moving the probe unit substantially parallel to a measurement face of the printed wiring board; and a board holding device for holding the printed wiring board to be measured. The probe unit moving device comprises an X-rail guiding the probe unit in an X-axis direction; an X-driving device moving the probe unit along the X-rail; a Y-rail guiding the probe unit in a Y-axis direction; a Y-driving device moving the probe unit along the Y-rail; and a control unit controlling the turn device, the moving device, X-driving device, and the Y-driving device. The board holding device may include a clamp, a plate with a screw, and so on. The X- or Y-driving device may include a motor and a motor driver.

According to the present invention, the impedance measuring device includes the turn disk comprising a shift device shifting the probe from the first position to the second position in a substantially continuous manner. The shift device comprises a shift rail between the first and the second position; and a probe moving device for moving the probe along the shift rail. The control unit integrally controls the probe moving device.

According to the present invention, the probe unit for measuring impedance for a printed wiring board comprises a probe having a connecting portion and a first and a second contact styli to be contacted with a first and a second predetermined points on the printed wiring board; a turn disk having a turn center and a mounting position, on which the probe is mounted with the connecting portion being fixed to the mounting position at a first angle relative to the turn disk; a turn device for turning the turn disk around the turn center such that the probe turns substantially parallel to a measurement face of the printed wiring board; and a moving device for moving the probe toward the measurement face of the printed wiring board such that the first and second contact styli are contacted with the predetermined points. The probe can be mounted on the mounting position such that the connecting portion is fixed to the mounting position at a second angle relative to the turn disk. And at least one distance between the turn center and one of the styli is changed by fixing the connecting portion of the probe at the second angle.

According to the present invention, the turn disk comprises a spinning device turning the probe from the first angle to the second angle in a substantially continuous manner.

According to the present invention, the spinning device comprises a pivot axis of the connecting portion, around which the probe is turned; a probe spinning device for turning the probe around the pivot axis; and a lock notch securing a turning position of the probe. The probe spinning device may include a motor as mentioned before.

According to the present invention, the probe has a third contact stylus to be contacted with a third predetermined points on the printed wiring board. The third contact stylus is fixed to the probe with another resilient member.

According to the present invention, at least one of the three styli can be fixed to another position of the probe by being shifted from an original position thereof such that the shifted stylus can be contacted with another predetermined point on the printed wiring board.

According to the present invention, the control system for a impedance measuring device for a printed wiring board comprises an impedance measuring part which measure a characteristic impedance of the printed wiring board to be measured; a main control unit controlling movement of a probe unit having a probe with a contact stylus to be contacted with a predetermined point on the printed wiring board, where the probe unit comprises a probe device which changes a position of the probe; and an input-output device receiving a signal from a sensor and controlling a relay. The main control unit controls integrally the probe device. The probe device may be any kind of device to move the probe and may include any kind of device such as a servomotor, a stepping motor, an ultrasonic motor, a linear motor, and any other type of motor, and any kind of driving device such as an engine.

The present invention also seeks to provide an impedance measuring device for the printed wiring board that has a probe unit such as a coaxial probe that includes a first and a second contact styli whose top tips point to the same direction wherein the second contact stylus is placed with a predetermined distance from the first contact stylus and a test probe driving means for moving the test probe unit to any place over the printed wiring board to be measured in order to make the first and the second contact styli contact predetermined measuring points on the printed wiring board, wherein the impedance measuring device further comprises a second contact stylus turning means for turning the second contact probe around the first contact stylus.

The second contact stylus turning means can turn the second contact stylus around the first contact stylus to match a point of the signal conductor. In this manner the first contact stylus may be brought into contact with the edge of the signal conductor, and at the same time the second contact stylus may be brought into contact with the through-hole so so that the impedance of the signal conductor may be measured. The device can be widely applied to any use wherein contact styli are placed in contact with two points to be measured and the probe is not limited to the coaxial probe or cable.

The second contact stylus turning means preferably turns the second contact stylus around the first contact stylus as the central axis of turning. That is, if only the second contact stylus is designed to turn, a mechanism that enables the second contact stylus to turn independently form the first contact stylus movement may be provided in the vicinity of the top end of the test probe unit so that the mechanism could be small.

The present invention further provides the impedance measuring device for the printed wiring board that has the test probe driving means which holds the test probe unit having the first contact stylus and the second contact stylus provided at a position apart from the first contact stylus by a predetermined distance with its top tip facing the same direction as the first contact stylus top tip, moves the test probe unit or the probe unit to any point over the board to be tested, and makes the first and second contact styli contact predetermined points of measurement on the board to be tested, wherein the impedance measuring device further comprises a replacement contact stylus holding means that holds a replacement second contact stylus for replacement and a contact stylus replacing means that replaces the second contact stylus of the test probe unit mounted on the test probe driving means with the replacement second contact stylus held by the replacement contact stylus holding means.

In an impedance measuring device that has this type of constitution, when the distance is varied between the edge of the signal conductor on the board to be tested and the through-hole, the contact stylus replacing means replaces the second contact stylus with a replacement (a replacement second contact stylus) having a corresponding distance between the first and the replacement second styli to the distance between the edge of the signal conductor and the through-hole as the contact stylus holding means holds the replacement second contact styli for replacement that have the distances from the first contact stylus corresponding to respective distances. In this manner, if the second contact stylus that has a distance corresponding to the distance between the edge of the signal conductor and the through-hole is used, the first contact stylus may be brought into contact with the edge of the signal conductor and at the same time the second contact stylus may be brought into contact with the through-hole so as to measure the impedance of the signal conductor. Now, although here the impedance measurement for signal conductors is taken as an example, it is just an example as mentioned before. In this manner the impedance measuring device in accordance with the present invention can make measurements even when there is more than one distance between two points to be measured. Therefore, it can also contribute to the realization of automatic impedance measurement using the test probe unit, Furthermore, the replacement contact stylus holding means may have two or more contact stylus grasping means that grasp and release the second contact stylus that are driven by a driving means. The contact stylus replacement means may comprise the test probe driving means, the contact stylus grasping means and a driving control means that controls the test probe driving means and the driving means for the contact stylus grasping means.

To explain briefly the operation of this example, it is premised that the test probe unit can be attached or detached by applying force to a specific part that contains the second contact stylus in a specific direction and that the replacement second contact stylus used also contains this specific part. First, there are at least one contact stylus grasping means (#1) that is open or empty or does not hold a replacement second contact stylus and one contact stylus grasping means (#2) that holds or grasps a replacement second contact stylus (#B). Then, with the contact stylus replacing means, the driving control means drives the test probe driving means to convey the second contact stylus (#A) of the test probe unit to a position such that it can be grasped by the empty contact stylus grasping means (#1) and that the second contact stylus (#A) is grasped by controlling the driving means of the contact stylus grasping means (#1). As the second contact stylus (#A) is grasped and fixed, the driving control means drives the test probe driving means to a specific direction to remove or detach the second contact stylus (#A) from the test probe unit. Then, the driving control means further drives the test probe driving means to install or attach the replacement second contact stylus (#B) on the test probe unit through a specific operation, where the replacement second contact stylus (#B) is grasped by the contact stylus grasping means (#2). When the replacement second stylus (#B) is installed, the driving control means controls the driving means of the contact stylus grasping means (#2) to open the grasping of the replacement second contact stylus (#B). Thus, the replacement of the second contact stylus (#B) is completed.

By adopting this constitution, as the test probe driving means can be commonly used as a part of the contact stylus replacing means, the structure of the whole device can be further simplified.

Furthermore, it is desirable to install in the impedance measuring device a turning position calibration means that calibrates the installation position in the turning direction of the second contact stylus around the first contact stylus of the test probe unit mounted on a test probe driving means as the central axis of turning. That is, if the installation position in the turning direction of the second contact stylus around the first contact stylus as the central axis of turning is displaced from the reference position, the second contact stylus is not correctly brought into contact with the point of measurement. Thus, it may prevent the device from applying to an automated operation. Also, turning or replacing of the second contact stylus may cause displacement of the installation position in the turning direction of the second contact stylus. Thus, the turning position calibration means can calibrate the installation position in the turning direction of the second contact stylus around the first contact stylus as the central axis of turning when it is needed to make more precise and accurate measurement.

It is premised that the second contact stylus comprises a ring that has a notched or missing part and is installed as the center axis of the ring is aligned to the center axis of the first contact stylus. The turning position calibration means may comprise a reference engaging part, whereby the test probe unit engages with the reference engaging part while the ring having a notched or missing part is inserted when the turning position of the second contact stylus around the first contact stylus is in a reference position.

With such constitution, the turning position of the second contact stylus may be finally adjusted by turning the second contact stylus as the notched part of the second contact stylus is directed to the reference engaging part such that the test probe unit is made to engage with the reference engaging part. In this manner, the calibration of the installation position in the turning direction of the second contact stylus is completed. That is, a turning position calibration means that has such a simple constitution that the position in the turning direction of the second contact stylus around the first contact stylus as the central axis of turning can be calibrated.

Also, the impedance measuring device may comprise a reference resistance that has a reference impedance that can be measured with the test probe unit. Since such reference resistance is installed, the measurement equipment can be calibrated to perform the correct measurement. If the measurement equipment does not perform a correct measurement, the measurement setting can be adjusted based on the measurement result of this reference resistance in order to resume the correct measurement.

Then, when the turning position calibration means contains a reference engaging part, it is more efficient to enable the test probe unit to measure the reference resistance during a period that the test probe unit engages with the reference engaging part. In this manner, when the test probe unit is engaged with the reference engaging part, both the calibration of the position in the turning direction of the second contact stylus around the first contact stylus as the central axis of turning and the calibration of the measurement equipment can be performed concurrently so that the operation time can be shortened.

A test probe unit may be used that is installed on the impedance measuring device and has an elastic member that pushes the first contact stylus toward the tip end direction. If such test probe unit is used, the impact between them can be mitigated by the elastic member when the first contact stylus hits the board to be tested. This is especially effective when the impedance measurement of the board to be tested is made automatically. Thus, damage and deterioration of the first contact stylus and the board to be tested can be prevented, Also, the test probe unit that is used for the impedance measuring device equipped with the replacement contact stylus holding means and the contact stylus replacing means may be used whereby the second contact stylus is formed in a manner that can be attached to or detached from the first contact stylus in the longitudinal direction of the first contact stylus. When the test probe unit that has such constitution, only the part that contains the second contact stylus has to be replaced without replacing the first contact stylus. Thus, it is economical. Also, as the second contact stylus can be attached or detached by moving the first contact stylus in the longitudinal direction, the attachment and the detachment of the second contact stylus can be made by an axial directional movement of the first contact stylus. Since the axial directional movement is applied for the regular measurement by the test probe unit, no special mechanism for the operation is needed.

As mentioned earlier, the test probe unit used for the impedance measuring device with the turning position calibration means containing the reference engaging part may further have the ring with the notched part that engages with the reference engaging part. The test probe unit may be integrally installed with the second contact stylus and the ring having the central axis matched with that of the first contact stylus.

Since this operation is the same as mentioned earlier, it is omitted here. By providing a simple structure for the test probe unit, the second contact stylus can be calibrated in the turning direction around the first contact stylus as the central axis of turning. Now, needless to say, the shape and the number of notches on the ring provided on the second contact stylus can be arbitrarily modified based on the needs.

The above-discussed and other features and advantages of the present invention will be appreciated and understood by those skilled in the art from the following detailed description and drawings.

DETAILED DESCRIPTION OF THE PREFERRED EMBODIMENT

Figure 1:
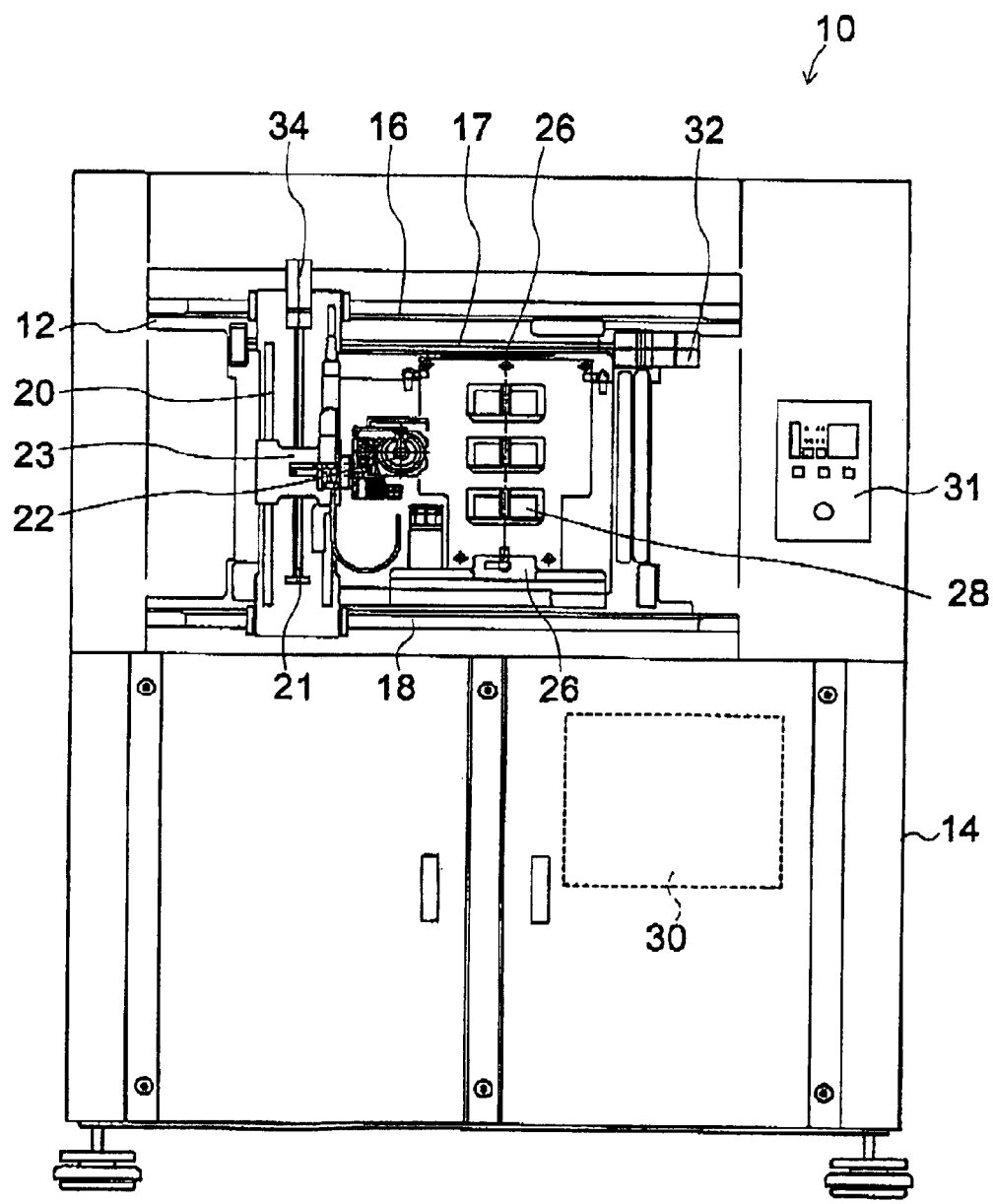
FIG. 1 is a front view that illustrates an outline of an impedance measuring device in accordance with the present invention.

Referring to FIG. 1, an example of the impedance measuring device according to the present invention is described in detail, FIG. 1 illustrates a front view that shows the outline of an impedance measuring device 10 for a printed wiring board in accordance with the present invention. In this impedance measuring device 10, a frame 12 is fixed inside of the body 14. Near upper and lower parts of the frame 12, X-rails 16 and 18 are horizontally fixed. A Y-rail 20 is fixed to a Y-plate hanged between the X-rails 16 and 18 so that it can move along the longitudinal direction or the parallel direction to the X-rails 16 and 18. A probe unit 22 is provided on a mounting part 23 which can slide along the Y-rail 20. The X-rails 16 and 18, and Y-rail 20 are parts of the test probe driving means. Board holding clamps 26, 26 that grasp the printed wiring board 28 to be measured are fixed on the frame 12. A control unit 30 is provided in the right lower part of the body 14. An operation panel 31 is provided on right lower portion of the body 14.

A ball screw 17 provided along the longitudinal direction of the X-rail 16 is turned by a servomotor 32. The upper and lower edges of the Y-plate of the Y-rail 20 is fixed to linear sliding parts so that the Y-plate and Y-rail moves along the X-rails as a connecting part which is fixed to the Y-plate and engaged with the ball screw 17 is moved by the ball screw 17. Another ball screw 21 provided on the Y-plate of the Y-rail 20 along the longitudinal direction of the Y-rail is turned by a servomotor 34. The probe unit 22 is fixed to the mounting part 23 which is fixed to the connecting block that engages with the ball screw 21. The servomotors 32 and 34 are controlled by the control unit 30, thereby, the probe unit 22 can be moved to any position in the movable plane between the X-rails 16 and 18. The probe driving means including these servomotors may be operated at the operation panel 31 and/or a remote control device such as a computer (not shown in FIG. 1). Another probe or another contact stylus or pin and/or a probe holder or a stylus holder could optionally be provided near the frame 12 for replacement.

Figure 2:
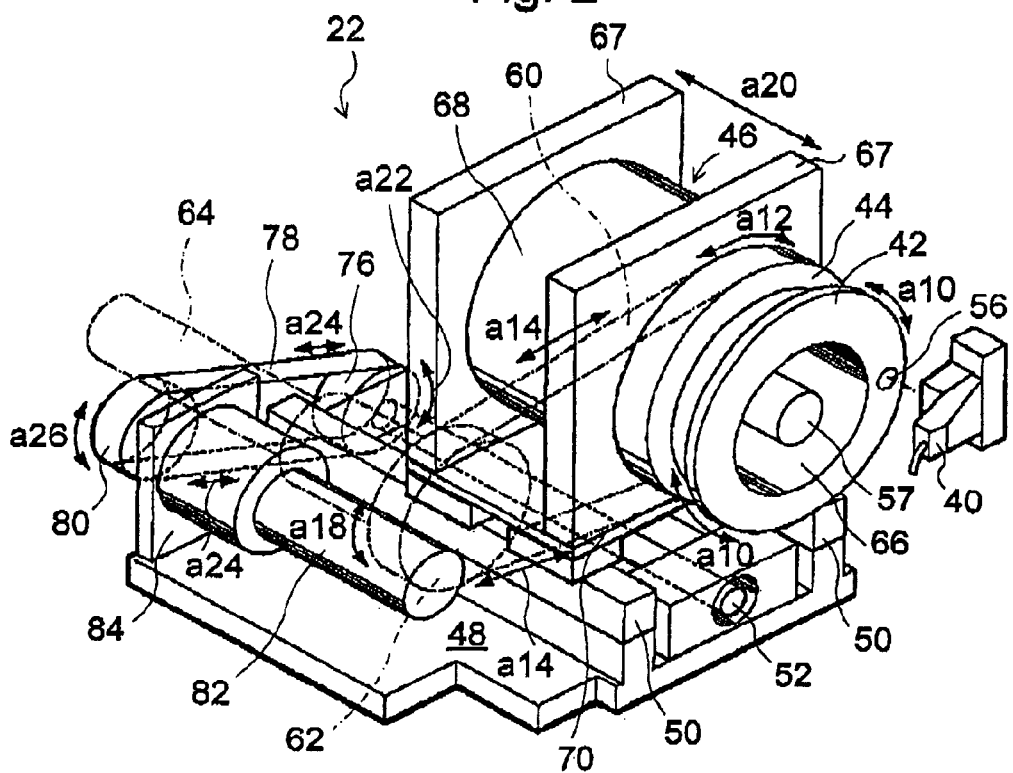
FIG. 2 is a perspective view of a probe unit of an impedance measuring device in accordance with the present invention.
Figure 4:
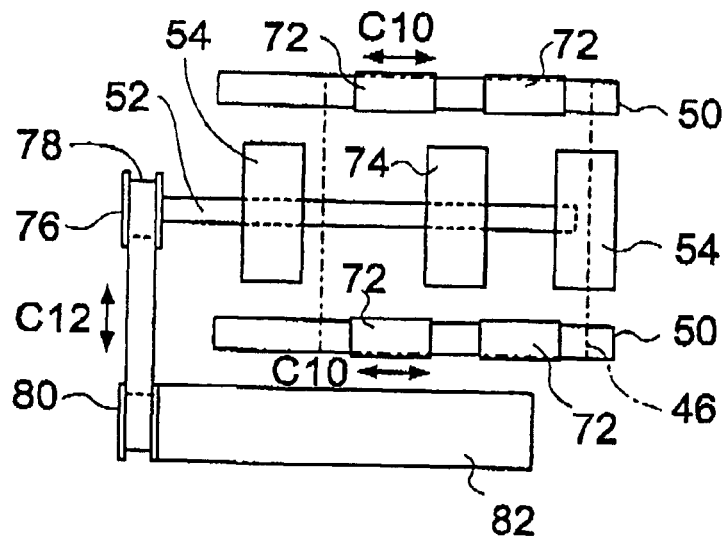
FIG. 4 is a schematic bottom view of a probe unit of an impedance measuring device in accordance with the present invention.

FIG. 2 illustrates a first example of the probe unit 22, which has a high frequency probe 40, a turn disk 42, on which the high frequency probe 40 is disposed, a pulley 44 connected to the turn disk 42, a turn main body 46 for supporting the pulley with bearings (not shown), a base plate 48 supporting the turn main body 46 being capable of sliding on left and right slide guides 50, 50, and a ball screw 52 supported with bearings (not shown) in bearing boxes 54 (FIG. 4). The high frequency probe 40 is disposed at a mounting position 56 located at a right portion on the turn disk 42 with a thread portion 58 (FIG. 5), in which electrical cables are also connected inside of the portion. A camera 57 is disposed at the top portion of an axis substantially aligned with a center axis of the center of the turn disk 42. The camera 57 can look at the measurement face of the board 28 so that the positions of points for measurement and the contact styli may be observed from a monitor (not shown).

The turn disk (or ring) 42 is fixed on an end portion of a cylindrical portion extending from the pulley 44 in an axial direction such that the rotation of the pulley 44 is directly transmitted to the turn disk 42. The pulley 44 and another pulley 62 are aligned in the same plane so that they are wrapped around by a timing belt 60. The pulley 62 is connected to and rotated by a servomotor 64 so that a rotation of the servomotor 64 is transmitted to the pulley 62 (arrow a18) and to the pulley 44 via the timing belt 60. Thus, the turn disk 42 is in turn turned around the turn center axis located inside of a circular opening 66 such that the high frequency probe 40 is rotated as the turn disk 42 turns. The servomotor 64 is supported with a supporting plate (not shown) fixed on the base plate so that the timing belt 60 can be stretched by the pulleys 44, 62.

The turn main body 46 is composed of opposing plates 67 substantially perpendicular to the turn center axis and a cylindrical portion 68 in between the opposing plates 67. The pulley 44 is rotatably fixed to the plate 67 closer to the turn disk 42. The base edges of the opposing plates 67 are fixed to a base plate 70 and in turn fixed to plate-like hexahedral mounting members 72 (FIG. 4), which are slidably mounted on the slide guides 50 such that a ball screw connecting member 74 (FIG. 4) attached to the base plate 70 moves the turn main body 46 as the ball screw 52 turns. The ball screw 52 has two end portions: one rests in the bearing box 54 and the other extends from the other bearing box 54 and has a pulley 76 such that the ball screw 52 can be rotated by the pulley 76, which is wrapped around by a timing belt 78 along with a pulley 80 connected to a servomotor 82. The pulleys 76, 80 are aligned in the same plane such that the wrapping timing belt 78 can transmit rotational force from the servomotor 82 to the ball screw 52. The servomotor 82 is fixed to a plate 84 perpendicular to the base plate 48 in a similar manner with the servomotor 82.

The probe unit 22 is provided on the Y-rail 20 with the probe facing the printed wiring board 28 as shown in FIG. 1. Appropriate brackets or parts are provided with the base plate 48 in order to fix the probe unit 22 to the mounting part 23. The probe unit 22 is moved by the probe unit moving device comprising X- and Y-rails 16, 18, 20 and the servomotors 32, 34 to a close place from measurement points on a measurement side of the printed wiring board 28.

Then, as arrows a10 show, the turn disk 42 is rotated by the connected pulley 44 (arrow a12), which transmits the movement via the timing belt 60 that in turn transmits the rotation of the servomotor 82 as arrows a14, a14 show, such that the high frequency probe 40 is positioned at a predetermined angle as described later. The turn main body 46 is moved in a sliding manner along the slide guides 50 (shown by an arrow a20, c10) as the connecting member 74 is moved by the rotation of the ball screw 52. The ball screw 52 is rotated by the pulley 76 as shown by an arrow a22 and the pulley 76 is turned by the timing belt 78 as shown by arrows a24, a24, which in turn moved by the pulley 80 as shown by arrow a26 that is connected to the servomotor 82. Thus, the turn main body 46 is moved toward the measurement side (or face) of the printed wiring board 28.

Figure 3:
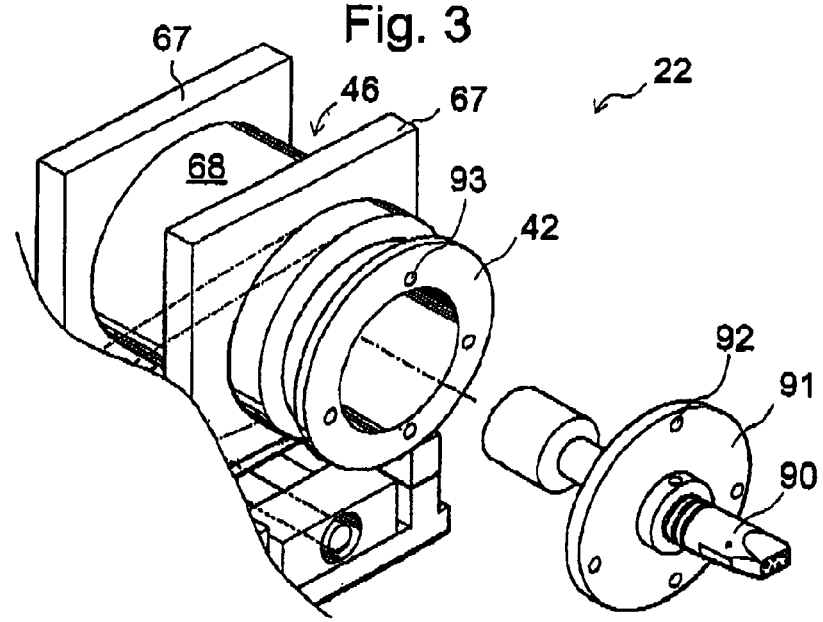
FIG. 3 is a partially broken perspective view of another probe unit of an impedance measuring device in accordance with the present invention.

FIG. 3 illustrates another example of the probe units 22. Since most configuration of each part is the same as in FIG. 2, redundant explanation will be omitted and the same numerical references are used. The probe unit 22 has a differential probe 90 in the middle opening 66 as shown. The probe 90 is fixed at the center of a mounting flange 91, which in turn is secured to the turn disk by four fasteners (now shown) such as bolts through common openings 92, 93 of the flange 91 and the turn disk 42. In the example, the differential probe 90 is disposed in the center of the mounting flange 91, but it may be disposed on a biased position of the flange 91 so that it is disposed at a deviated position from the center (i.e., the turn center) of the turn disk 42. The differential probe 90 also can be turned inside the mounting opening of the flange 91 so that a contact stylus or contact styli of the probe 90 may be shifted from the original position relative to the turn center of the turn disk 42. The differential probe 90 is also turned with the flange 91 as the turn disk 42 is rotated by the pulley 44 that is directly connected to the turn disk 42.

FIG. 4 illustrates a linear moving mechanism by the ball screw 52 and the servomotor 82. Substantially parallel slide guides 50 are disposed across the ball screw 52 supported with bearings (not shown) inside of the bearing boxes 54 positioned so as to make a rectangular shape with the two slide guides 50. The ball screw 52 has the rectangular connecting member 74 between the bearing boxes 54. Since the rotation of the connecting member 74 is regulated, the member 74 moves linearly as the ball screw 52 rotates. On the slide guides, four mounting members 72 are slidably disposed and the connecting member 74 is connected to the turn main body 46 (shown in an alternate long and short dash line) such that the linear movement of the connecting member 74 is transmitted to the main body 46 as shown by arrows c10. At the left end of the ball screw 52, the pulley 76 is provided, which is aligned with the pulley 80 connected to the servomotor 82 as a driving means. The pulleys 76, 80 are thereby wrapped around by the timing belt 78. The timing belt 78 may move as an arrow c12 shows.

Figure 5:
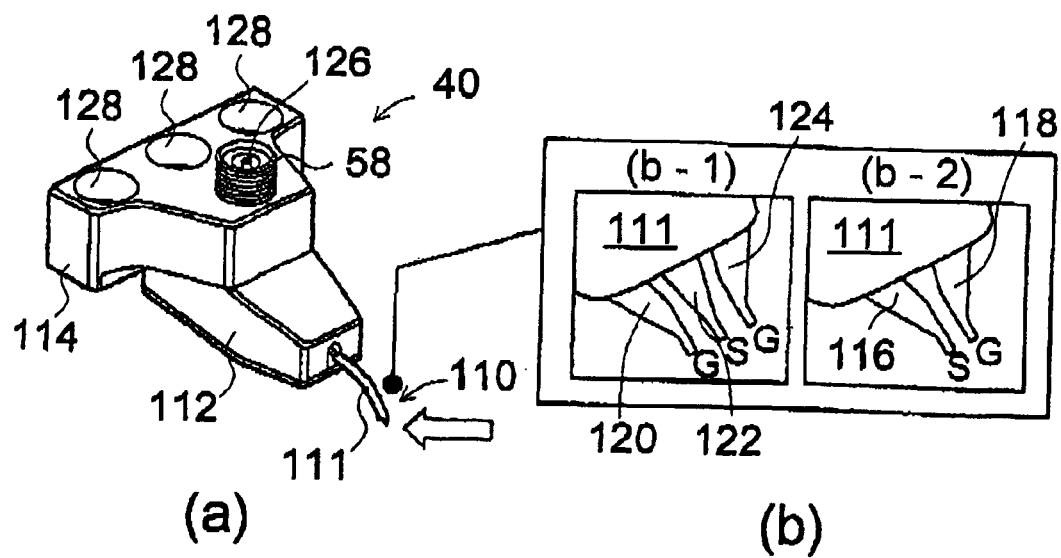
FIG. 5 is a perspective view of a high frequency probe with contact styli.

FIG. 5 illustrates the high frequency probe 40 with a plurality of contact styli. The probe 40 is mainly composed of probe part 110, a probe base body 112 having a tunnel-like window for the probe part 110 to extend from, and a mount base body 114 mounted on a part of the top face of the probe base body 112, where the electrical signal may pass.

The probe part 110 is composed of an insulation arm 111 having a signal contact stylus 116 and a ground contact stylus 118 (b-2), or a signal contact stylus 122 and ground contact styli 120, 124 (b-1). The contact styli 116, 118, 120, 122, 124 may be made of tungsten, beryllium alloy, or any other kinds of materials such as conductive material. Each contact stylus is separately hanged on the insulation arm 111 so as to have resiliency if the stylus is pressed against a measurement point of the board 28. The signal contact styli 116, 122 are insulated in the insulation arm 111 while the ground contact styli 118, 120, 124 may be insulated or grounded of the probe part. The tips of the contact styli 116, 118, 120, 122, 124 are pointing substantially the same direction.

The mount base body 114 has a coaxial cable connector 126 above the mounting portion of the base body 114 and three openings 128 behind the coaxial cable connector 126 in FIG. 5(a). The coaxial cable connector 126 has an outer cylindrical threaded body such that the probe 40 may be mounted at the mounting position 56 of the turn disk 42. Inside the outer body, a coaxial cable attachment is disposed at the center of the outer body. The three openings 128 may be utilized to mount the probe on the turn disk 42.

Figure 6:
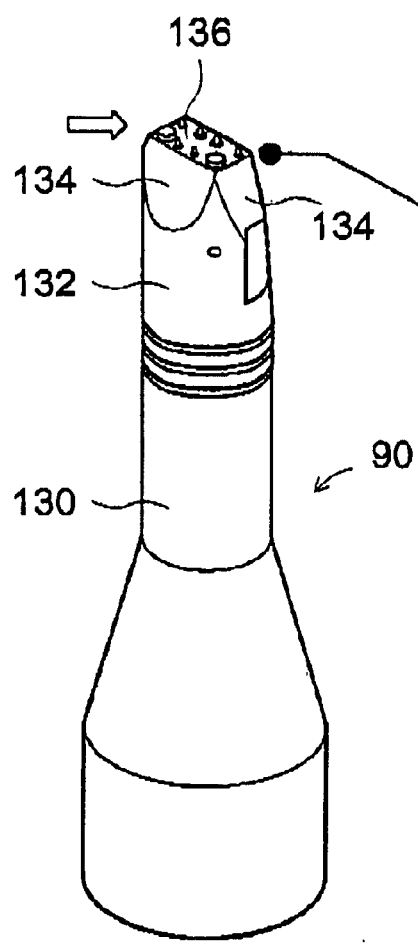
FIG. 6 is a perspective view of a differential probe with contact styli.
Figure 6:
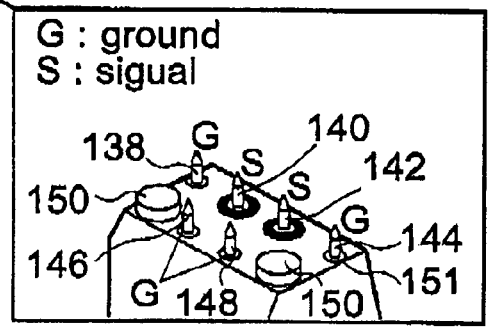
Figure 6:
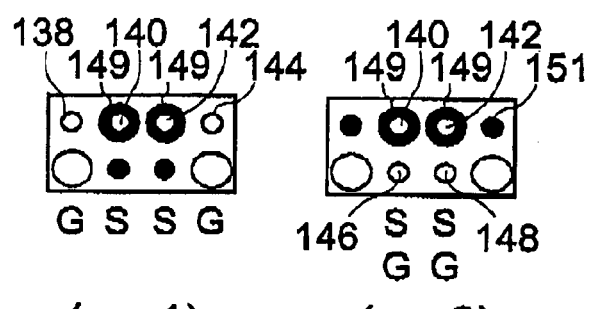

FIG. 6 shows the differential probe 90 having a probe main body portion 130 and a thinner probe holder portion 132. Four chamfered portions 134 are located at a top portion of the probe holder portion 132. A flat top face 136 of the differential probe 90 is surrounded by the four chamfered portions and has six contact styli 138, 140, 142, 144, 146, 148 in six recess portions on the top face 136. Two signal contact styli 140, 142 are plugged into two insulated sockets 149, respectively and four ground contact styli 138, 144, 146, 148 are plugged into four probe sockets 151, respectively. The contact styli 138, 140, 142, 144, 146, 148 are plugged in with resilient members 147 (FIG. 11) as shown later. At two corners of the top face 136, two pads 150 are disposed to stop the probe movement toward the board 28.

Two of the four ground contact styli may be removed and the top face 136 has two ground contact styli and two signal contact styli 140, 142 A line arrangement of the contact styli 138, 140, 142, 144 is shown in (c-1) and a rectangular arrangement of the contact styli 140, 142, 146, 148 is shown (c-2). Either arrangement may be made by replacing the plugged-in ground contact styli to the open two recesses for the contact styli. Further, the number of the ground contact styli may be changed from one to four. Optionally, the two signal contact styli 140, 142 could become ground contact styli so that the number of the ground contact styli may become five or six.

Figure 7:
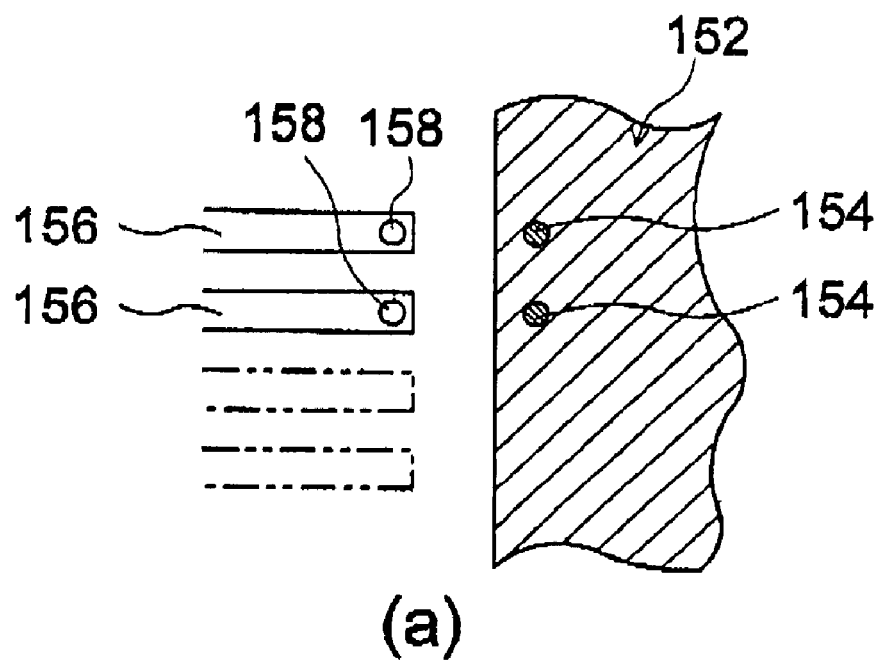
FIG. 7 shows measurement points on a printed wiring board.
Figure 7:
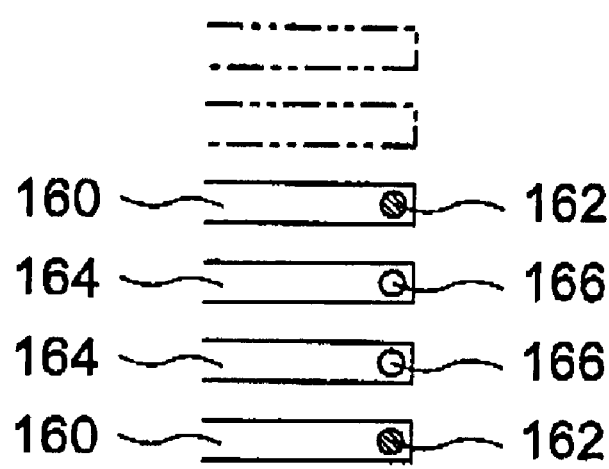

FIG. 7 shows two arrangements of measurement points on the printed wiring board 28. The rectangular arrangement of the contact styli may be used to test the printed wiring board 28 having a ground plate 152 with two ground points 154 (hatched circles) and circuit patterns 156 with two signal points 158 (open circles as shown in FIG. 7(a)). The ground points 154 may be deviated since the plate has basically the same ground potential at any portion. In the meantime, the line arrangement of the contact styli may be used to test the printed wiring board 28 having ground lines 160 with two ground points 162 (hatched circles) and circuit patterns 164 with two signal points 166 (open circles as shown in FIG. 7(b)). In another example, the lines 160 shown here for the ground could become other signal lines. Therefore, no ground line is contacted. However, the probe could measure a characteristic impedance among the signal lines.

Figure 8:
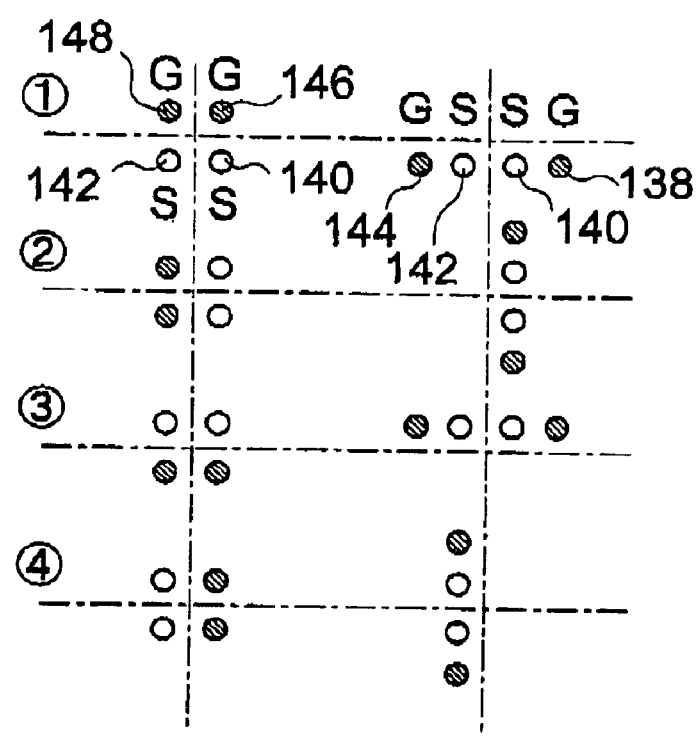
FIG. 8 shows contact stylus arrangement of a differential probe in FIG. 6.

FIG. 8 shows eight arrangements of the four contact styli, in which G as a hatched circle stands for the ground stylus and S as a open circle stands for the signal stylus. A rectangular arrangement in the left hand side of the top sample may be re-arranged in a line form by replacing the two ground styli at both sides of the signal styli. A rectangular arrangement in the left hand side of the second top sample may be re-arranged in a vertical line form by replacing the two ground styli into both sides of the signal styli. A rectangular arrangement in the left hand side of the third top sample may be re-arranged in a horizontal line form by replacing the two ground styli at both sides of the signal styli. A rectangular arrangement in the left hand side of the bottom sample may be re-arranged in a vertical line form by replacing the two ground styli at both so sides of the signal styli. The four samples may be obtained by rotating one probe 90 for each right angle.

Figure 9:
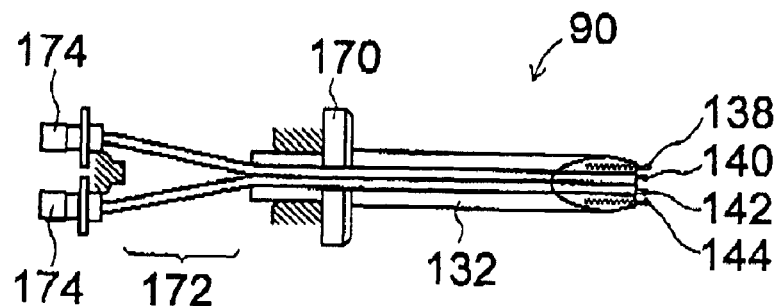
FIG. 9 is a side view of a differential probe with a partial cross sectional view.
Figure 10:
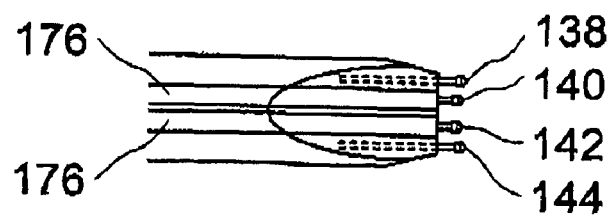
FIG. 10 is an enlarged view of a top portion of a differential probe in FIG. 9.

FIG. 9 shows a side view of a sample of the differential probe 90 with a partial cross sectional view. The probe 90 has the contact styli 138, 140, 142, 144 pointing the right direction, chamfered portions, a probe holder portion 132, a flange 170 and a connecting cable part 172, and terminals 174 for the signal cables. Thus, the signal cables disposed in the portion 132 are shown as if the portion 132 were transparent. The signal cables are insulated from the signal contact styli to the terminals. The flange 170 is used to fix the probe 90 at the fixing (or mounting) position of the flange 91. FIG. 10 shows a partial cross sectional view of the top portion of the probe 90. The signal cables are insulated by insulator 176.

Figure 11:
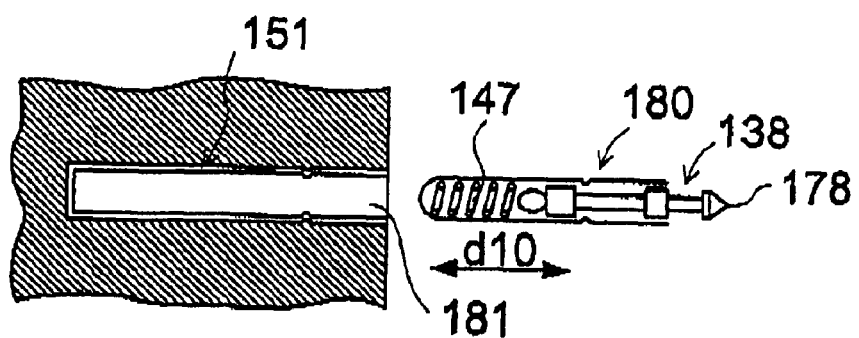
FIG. 11 shows how a contact stylus is plugged into a socket of a differential probe.

FIG. 11 illustrates a replacing mechanism of the ground contact stylus 138 as an example. The ground contact stylus is composed of a top tip 178 at the right end, a plunger 180, and a spring 147 as the resilient member such that the ground contact stylus may be contacted with a measurement point of the board 28 resiliently to absorb the shock with the resilient member 147. The socket 151 has a recess 181 that fits the plunger 180 such that the stylus may be pushed into the socket 151 as shown by arrow d10 and stayed inside even if the stylus 138 is pulled by a small pulling force since the socket 151 has lock portion and the plunger has an engaging portion. The stylus may be pulled out with a pulling force that overcomes a locking resistance. The replacement of the stylus may be made manually or automatically. An appropriate machine may be employed for such replacement.

Figure 12:
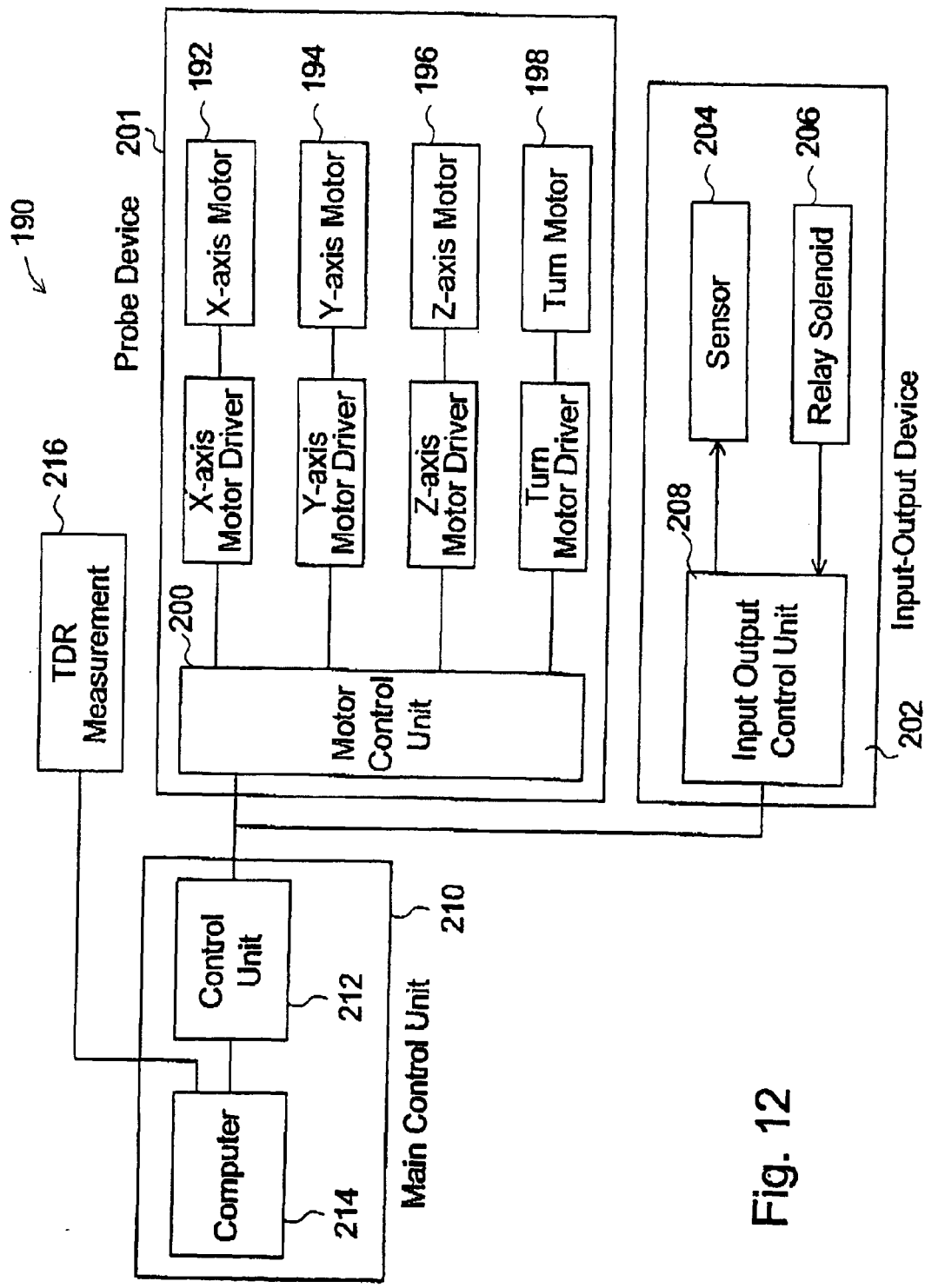
FIG. 12 is a block diagram of a control system in accordance with the present invention.

FIG. 12 illustrates a control system 190 of the impedance measuring device 10. An X-axis motor 192 is the servomotor 32, a Y-axis motor 194 is the servomotor 34, a Z-axis motor 196 is the servomotor 82, and a turning motor 198 is the servomotor 64. Each motor is driven by each motor driver as shown in the figure. All motor drivers are controlled by a motor control unit 200 integrally. An probe device 201 is composed of the motor control unit 200 and the motor drivers and motors 192, 194, 196, 198. An input-output device 202 is drawn under the above motors. The input-output device 202 is composed of an input-output control unit 208, a sensor part 204 and an actuator part 206. The sensor part 204 is composed of any kinds of sensors such as end limit sensors, origin sensors, and other sensors of the impedance measuring device 10. The actuator part 206 is composed of any kinds of actuators such as solenoid valves for an ionizer, relays for switching cameras, and so on. An input-output control unit 208 receives sensor signals and output actuator signals to the actuator part 206.

The input-output device 202 and the motor control unit 200 are connected to a main control unit 210. The main control unit is composed of a control unit 212 and a personal computer 214 as a control processing device. A TDR measurement device 216 is composed of contact styli plugged in the probe mounted on the turn disk 42 of the probe unit 22, and a measurement device of the signals transmitted from the contact styli. Here, TDR stands for time domain reflectometry.

Figure 13:
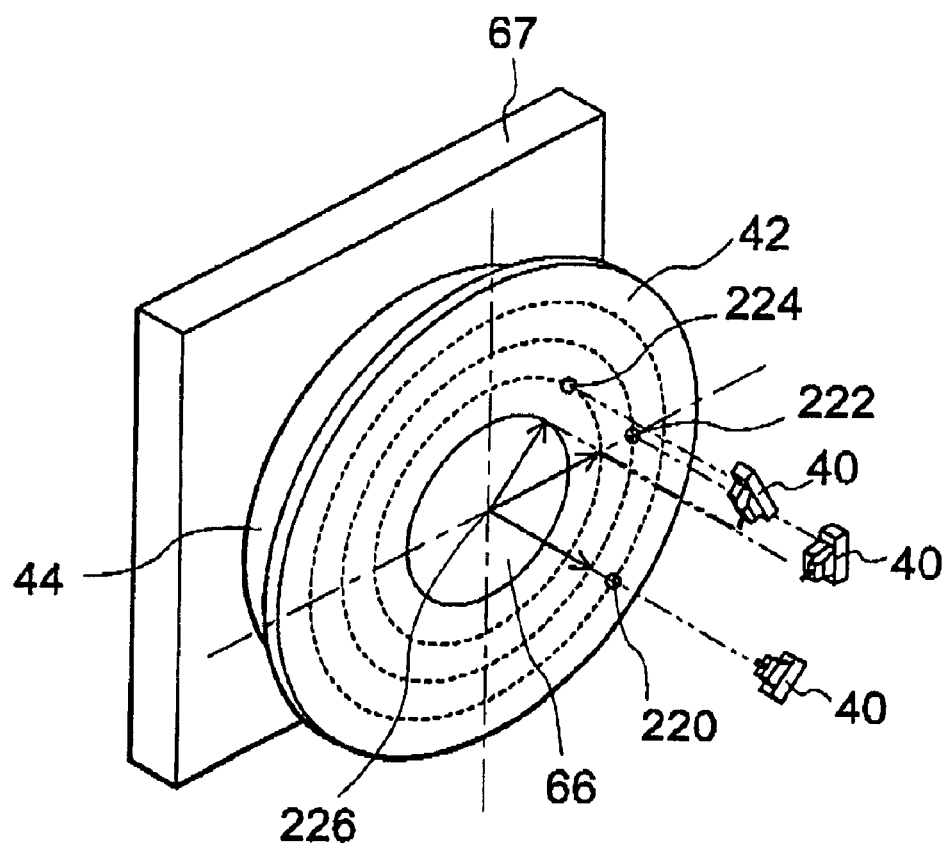
FIG. 13 is a perspective view of a turn disk and surrounding parts.

FIG. 13 shows an example of the turn disk 42, which has more than one mounting positions for the high frequency probe 40. Since the basic configuration other than turn disk 42 is the same as in FIG. 2 or 3, only the turn disk 42 and surrounding parts are shown in the figure. The other parts should be the same as described before, the same numerical references are used for most parts and redundant explanation will be omitted. The turn disk has a first position 220, a second position 222, and a third position 224 on the board-side face of the turn disk 42. The turn disk has the circular opening 66 and the turn center 226 at the center of the opening 66 although only an imaginary center exits since it is vacant. The first position 220 is farthest from the turn center 226, the second position 222 is second farthest from the center 226, and the third position 224 is the closest among the three positions. The positions are not aligned in a straight line although they may be aligned in any way as long as the distances between each of the positions and the center 226 are kept constant. The probe 40 may be optionally mounted at any one of the positions such that the probe part 110 is oriented to the turn center 226. Therefore, the probe 40 mounted at the third position has the shortest radius of the tip locus or trajectory as mentioned later.

Figure 14:
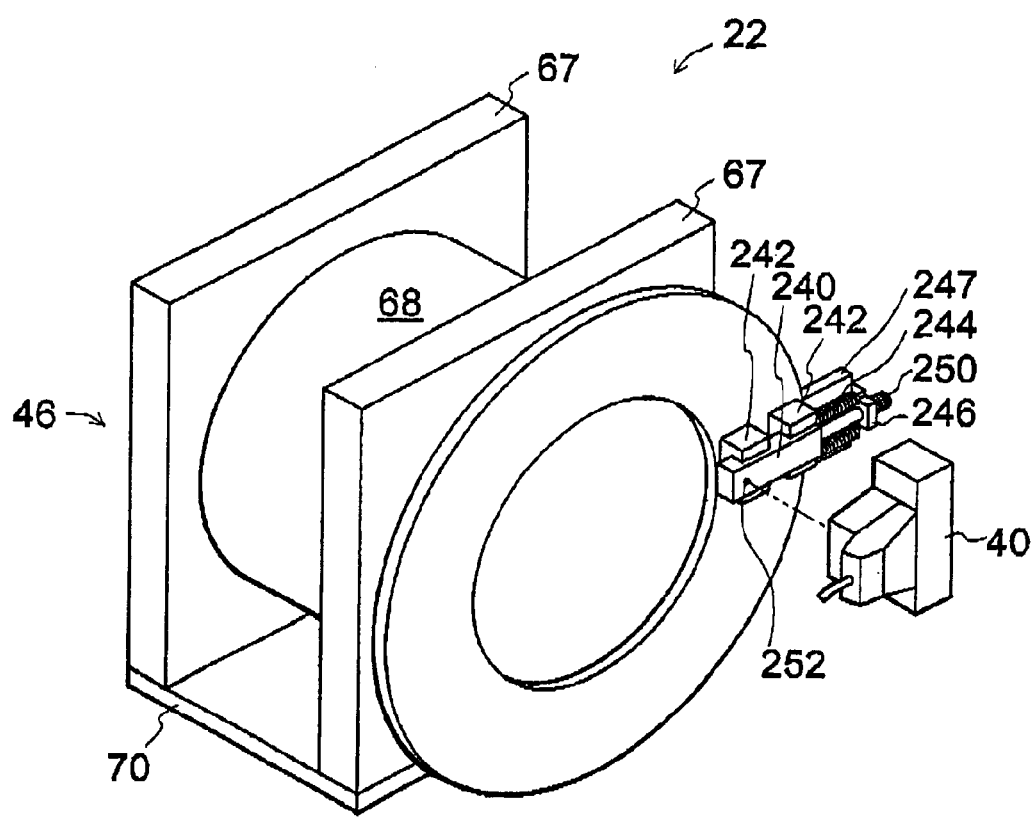
FIG. 14 is a perspective view of another example of turn disk and surrounding parts.

FIG. 14 shows another example of the main turn body 46 of the probe unit 22 with the probe 40. Since the basic configuration other than turn disk 42 is the same as in FIG. 2 or 3, only the main turn body, the turn disk 42 and surrounding parts are shown in the figure. Although each part is slightly modified from that in the figure, the same numerical references are used for most parts and redundant explanation will be omitted.

The turn disk has a shift bar 240 disposed in recess portions of left and right bar holding parts 242, which in turn are fixed on the board-side face of the turn disk 42. In the figure, the bar 240 extends along a substantially horizontal diameter of the circular turn disk face. The bar 240 is slidably secured in the recess portions and bonded with one end of spring 244, the other end of which is fixed to a shaft holding block 246 in order to pull the bar 240 closer to the shaft holding block 246. The shaft holding block 246 fixed at an extended portion 247 at the periphery of the turn disk 42 has an opening, through which an extending shaft 248 rotatably passes. The shaft 248 has a threaded portion around outer 16 portion in the figure and engages with the threaded nut opening of the opening of the shaft holding block 246 such that the shaft rotates to make the bar pushed away or pulled closer to the shaft holding block 246. At the other end portion or the right portion of the shaft, a turn knob 250 with a larger diameter is disposed such that the shaft 248 may be turned. Near the left edge of the shift bar 240, a mounting opening 252 is formed such the probe 40 is fixed to the bar 240.

Figure 15:
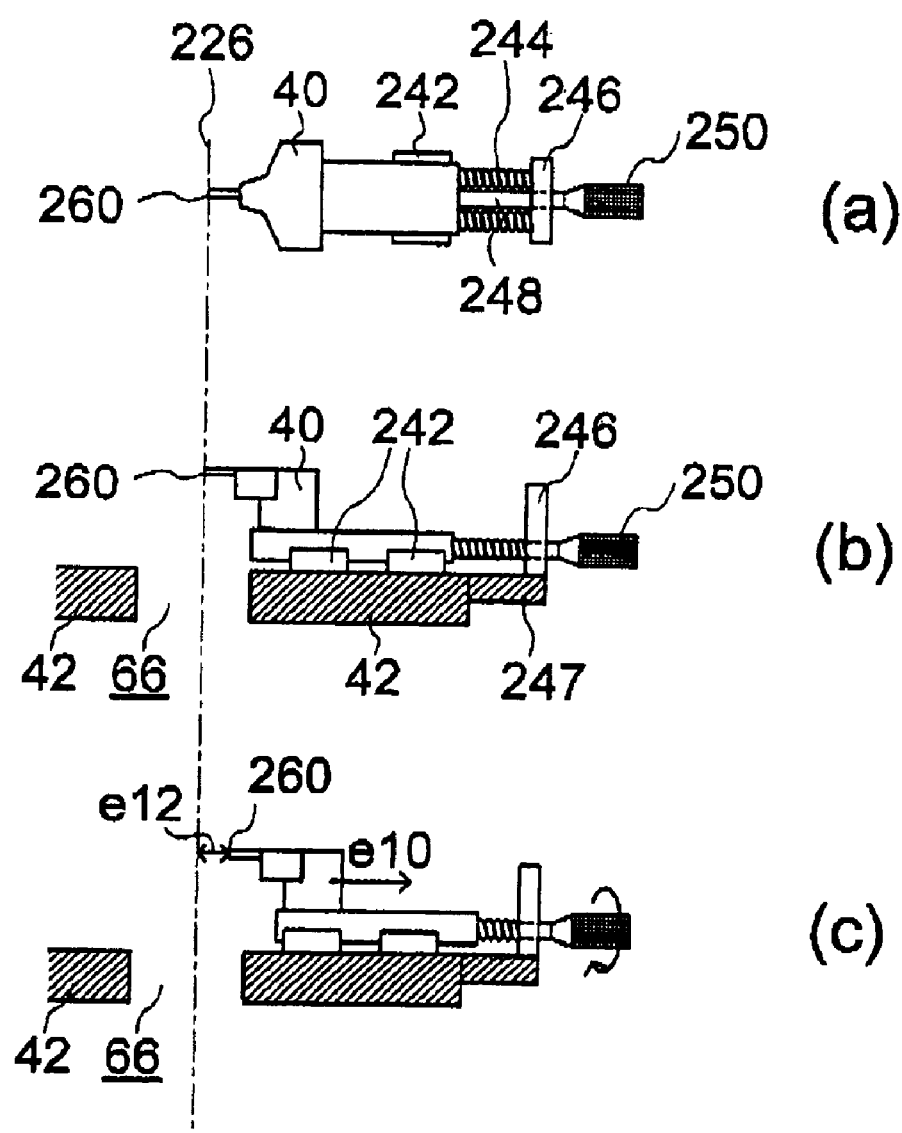
FIG. 15 is a side view with a partial cross sectional view of another turn disk and surrounding parts.

FIG. 15 illustrates the mechanism of displacement of the probe 40 with the bar 240. As mentioned above, the probe 40 having a tip, portion 260 of the probe part 110 is mounted near the left edge of the bar 240 such that the tip portion 260 is positioned at the turn center 226. Then, the turn knob 250 is turned by a hand or an appropriate tool clockwise or counterclockwise to move the bar 240 rightward or toward the shaft holding block 246 (FIG. 15(b)). The bar 240 may be pulled by the spring 244 (FIG. 15(c)) as the probe 40 is shifted rightward as shown by arrow e10 such that the distance of e12 is made between the tip 260 and the turn center 226.

Figure 16:
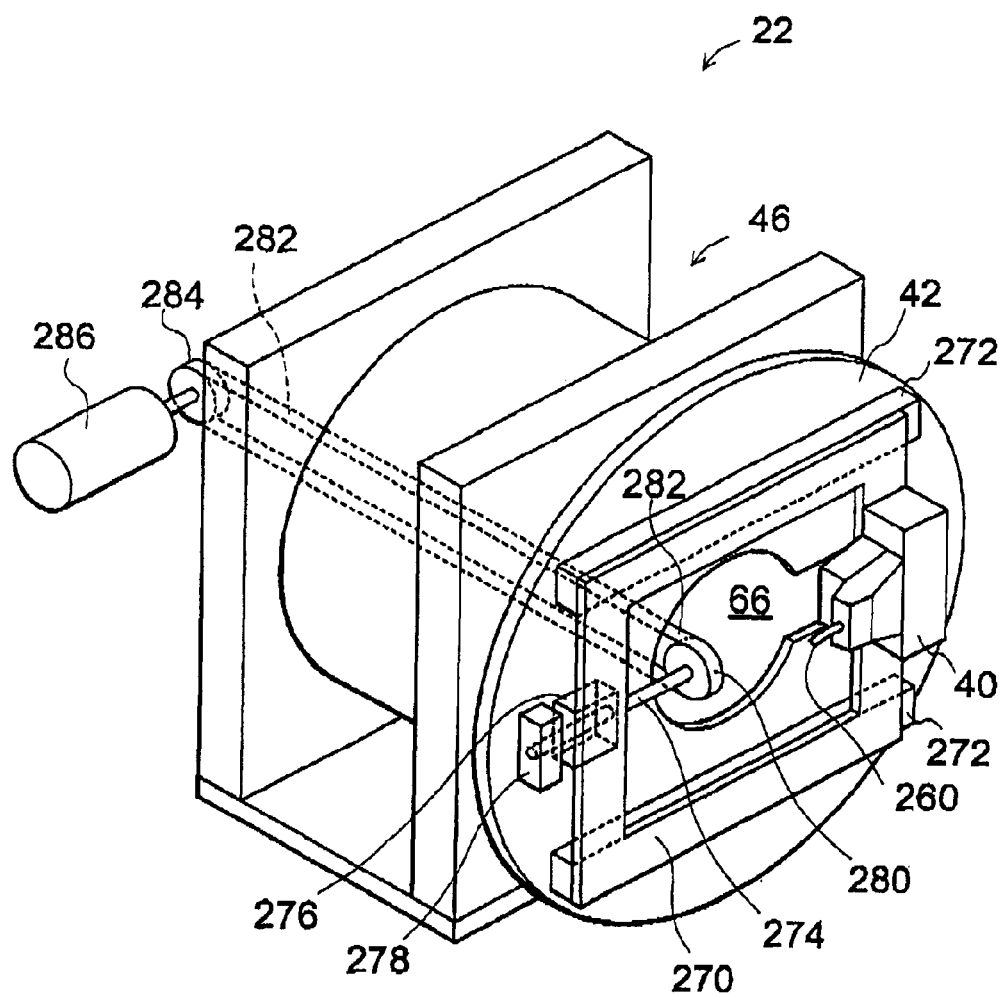
FIG. 16 is a perspective view of another turn disk and surrounding parts.

FIG. 16 shows another example of the main turn body 46 of the probe unit 22 with the probe 40. Since the basic configuration other than turn disk 42 should be the same as in FIG. 2 or 3, only the main turn body 46, the turn disk 42 and surrounding parts are shown in the figure. Although each part is slightly modified from that. In the figure, the same numerical references are used for most parts and redundant explanation will be omitted.

Figure 17:
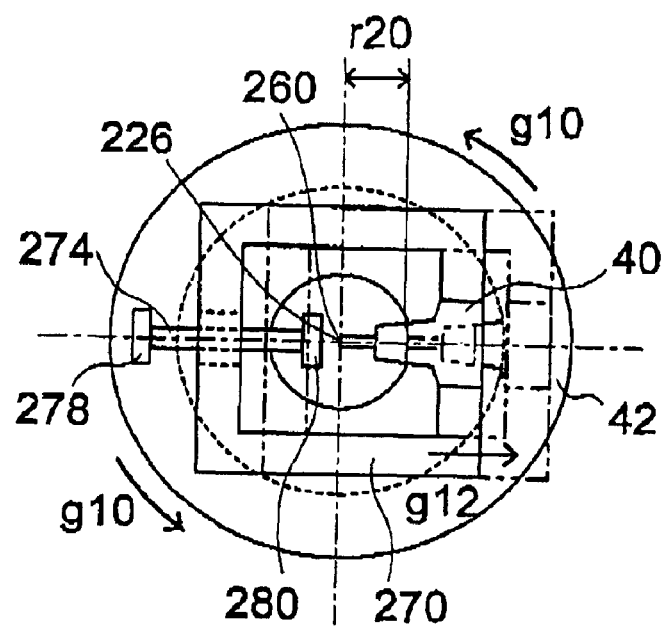
FIG. 17 is a front view of a turn disk and surrounding parts in FIG. 16.

The probe 40 is mounted on the right frame member of a rectangular frame 270 to face the printed wiring board 28. The top and bottom frame members of the frame 270 are slidably mounted on two substantially parallel slide guide bars 272 such that a ball screw 274 engages with the connecting block 276. As the screw 274 rotates, the connecting block 276, which is fixed to the left member of the frame 270, transmits a shifting force to the connected frame 270. The ball screw 274 is supported rotatably with a bearing in a bearing box 278. At the other end portion of the ball screw 274, a pulley 280 is disposed and aligned with another pulley 284 connected to a shaft of a servomotor 286. A timing belt 282 is wrapped around the aligned pulleys 280, 284 and penetrating the opening 66 in an axial direction. FIG. 17 shows a side view from the board side to illustrate how the turn disk 42 turns. As the probe 40 shifts the position relative to the turn disk 42 in a manner shown by an arrow g12, the turn disk 42 turns counterclockwise as shown by arrows g10. When the tip 260 is located at the turn center 226, the rotation of the turn disk 42 makes a small circular locus by each contact stylus which is located at a position other than the exact the turn center 226 as described later. As the probe shifts rightwards with a distance (arrow r20) between the tip 260 and the turn center 226, the turn rotation may make a stylus tip trajectory with a curvature of radius. If the shift is synchronized with the rotation so that both movements are made at the same time, the stylus tip trajectory could be changed to a different one from a regular circle.

Figure 18:
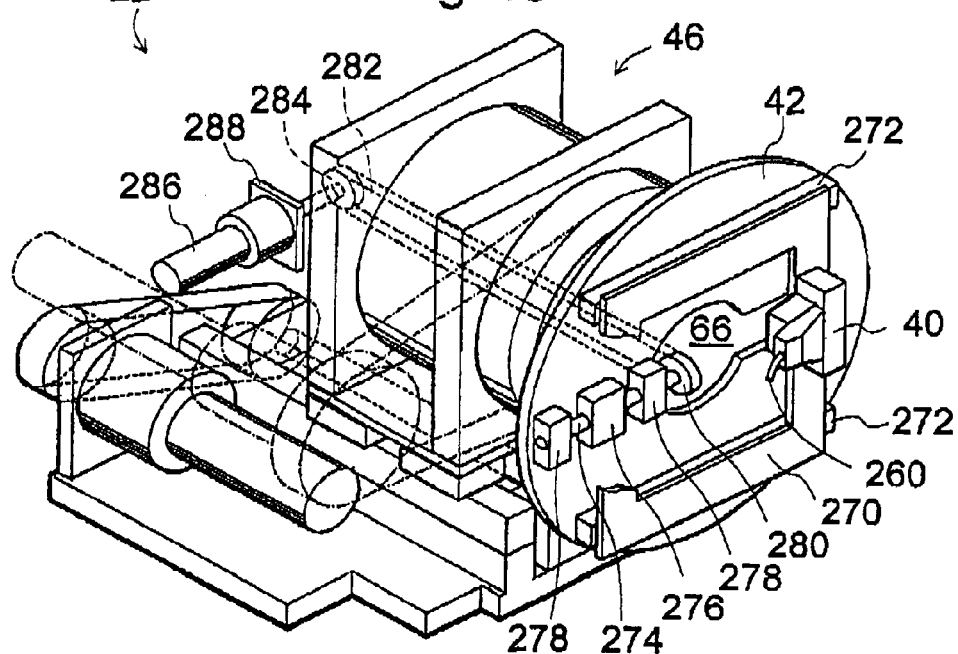
FIG. 18 is a perspective view of a probe unit of an impedance measuring device in accordance with the present invention.

FIG. 18 shows another example of the probe unit 22 with the so probe 40 on a rectangular frame, a left part of which is partially broken for the illustration of a shifting mechanism. Since most configuration is the same as in FIG. 16 and the probe unit mechanism should be the same as shown in FIG. 2, the same numerical references are used for most parts and redundant explanation will be omitted.

The probe 40 having a tip 260 pointing the printed wiring board 28 to be measured is mounted on a rectangular frame 270, which slides on slide guides 272 as a ball screw 274 supported with bearings inside bearing boxes 278 turns to move a connecting block 276 which is connected to the frame 270. The ball screw 274 has a pulley 280 on the right end portion aligned with a pairing pulley 284 such that a timing belt 282 is wrapped around the pulleys 280, 284. The timing belt 282 transmits rotational movement of a servomotor 286 located behind the turn main body 46. The servomotor 286 is fixed by a plate 288 to the turn main body 46. The probe shifting mechanism may be operated separately and/or independently from the other moving mechanism. Or it may be operated integrally.

Figure 19:
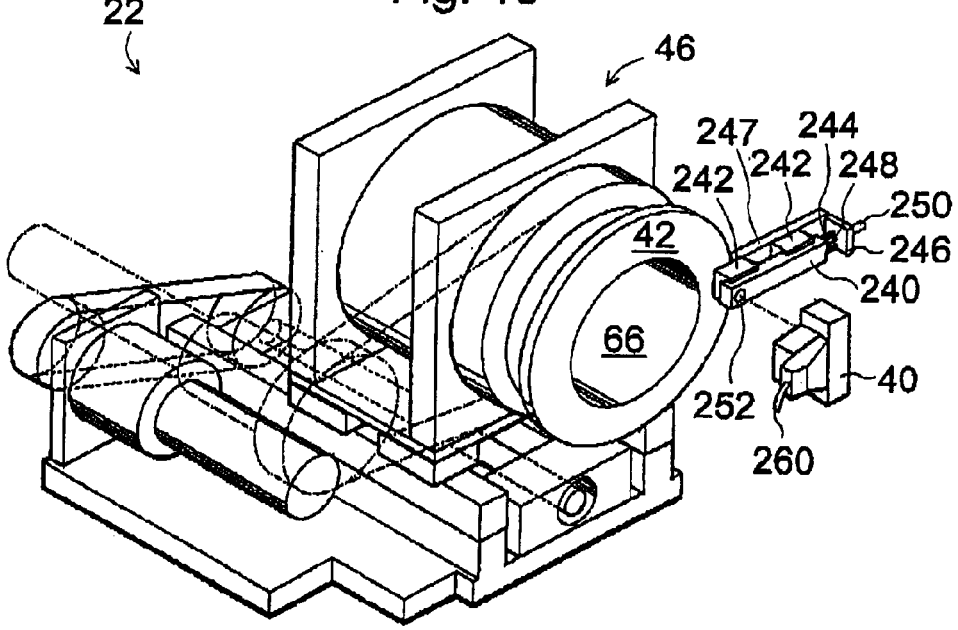
FIG. 19 is a perspective view of another probe unit of an impedance measuring device in accordance with the present invention.

FIG. 19 shows another example of the probe unit 22 with the probe 40 on a shift bar 240. Since most configuration is the same as in FIG. 14 and the probe unit mechanism is the same as shown in FIG. 2, the same numerical references are used for most parts and redundant explanation will be omitted.

The turn disk 42 has an extending portion 247 extending radially from the outer periphery of the turn disk 42. On the extending portion 247 and the turn disk 42, two bar holding parts 242 having a C-shape at the side view are fixed with each recess portion aligned such that the shift bar 240 may slidably be secured in the recess portions. The shift bar 240 is pulled rightward by two springs 244 and engages with the threaded shaft 248, which may be turned by a knob 250. The probe 40 is secured to a mounting opening 252. The tip 260 of the probe 40 may be shifted as shown in FIG. 15.

Figure 20:
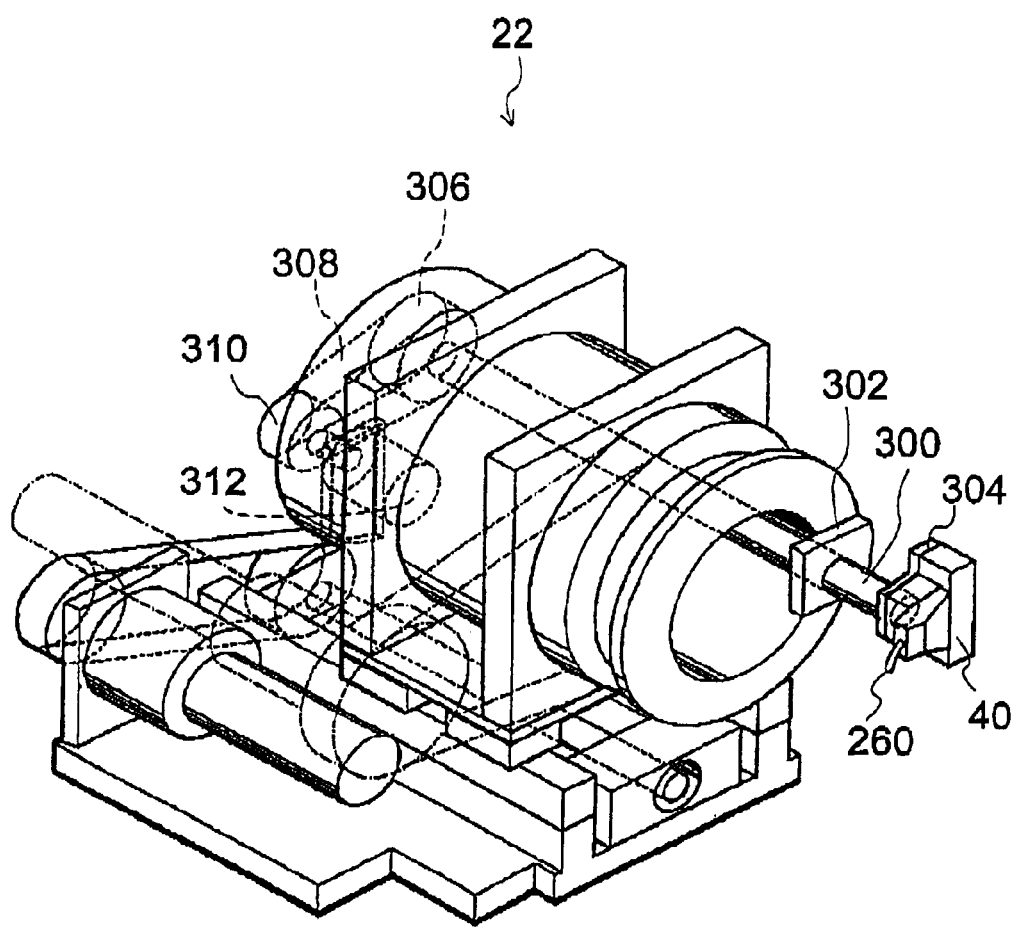
FIG. 20 is a perspective view of yet another probe unit of an impedance measuring device in accordance with the present invention.

FIG. 20 shows another example of the probe unit 22 with the probe 40 on an end face of a rotation shaft 300 rotatably supported with a plate 302 mounted on the turn disk 42. Since most configuration is the same as in FIG. 2, the same numerical references are used for most parts and redundant explanation will be omitted.

The probe 40 having a tip 260 pointing the board 28 is mounted on a probe sitting plate 304 at the end face of the rotation shaft 300. At the other end of the shaft 300, a pulley 306 is fixed so that the shaft 300 is rotated as the pulley 306 is turned by a timing belt 308 transmitting rotational movement of a pulley 310 connected to the shaft of a servomotor 312. The shaft 300 may be turned separately and/or independently from the other moving mechanism. Or it may be operated integrally with the other mechanism.

Figure 21:
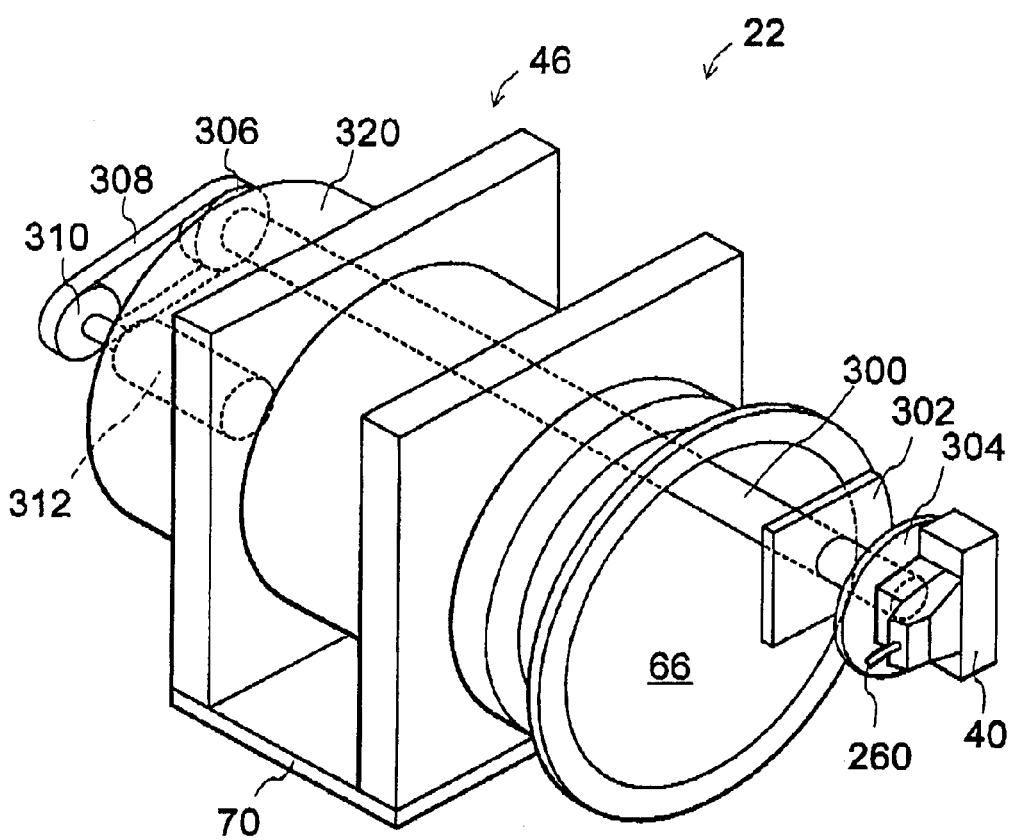
FIG. 21 is a perspective view of a turn main body of a probe unit of an impedance measuring device in accordance with the present invention.

FIG. 21 shows an example slightly modified from the one in FIG. 20. In the figure, only the main body 46 including the turn disk 42 and the probe 40 is shown and other parts are the same as shown in FIG. 20. The probe 40 is mounted on a circular probe sitting plate 304, which is fixed to an end face of a shaft 300 being rotatably supported with a plate 302 having a through hole. The shaft 300 penetrate the turn main body 46 to the back side such that a pulley 306 at the other end portion of the shaft 300 is aligned with another pulley 310 connected to a shaft of a servomotor 312. The pulleys 306, 310 are wrapped around by the timing belt 308 in the same manner as described before.

Figure 22:
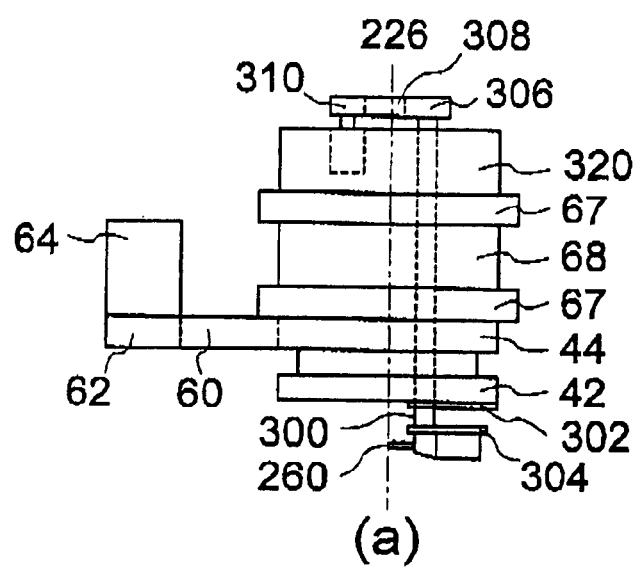
FIG. 22 is a combination of top and front views to illustrate a turning mechanism.
Figure 22:
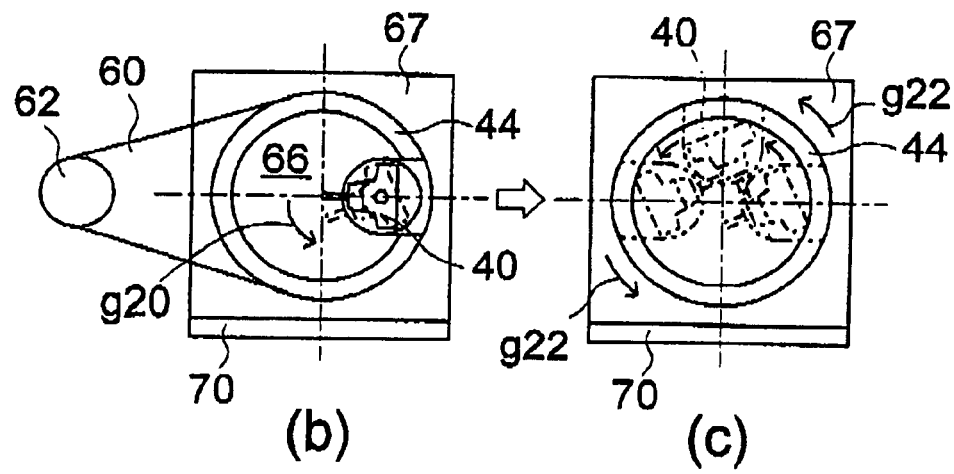

FIG. 22 shows a top view and a side view of the turn main body 46 shown in FIG. 21 so that the turning mechanism is easily illustrated. The top view (a) of the main body 46 shows a parallel and lined structure of the probe 40, the sitting plate 304, the turn disk 42, the pulley 44, a plate 67, a cylindrical portion 68, a plate 67, another cylindrical portion 320, and the pulley 306 in FIG. 22(a). The shaft 300 deviated from the turn center 226 penetrates the main body 46 through the opening 66. The pulley 44 is aligned with another pulley 62 connected to a servomotor 64. The pulleys 44, 62 are wrapped around by a timing belt 60 such that the rotation of the servomotor transmits to the turn disk 42. A side view of (b) shows how the turn disk 42 rotates around the turn center 226 (arrows g22) or the turn center axis and also how the probe turns at the end of the shaft 300 (arrow g20). If the probe is fixed at a first angle where the tip 260 coincides with the turn center 226 as shown in the solid line, the contact stylus trajectory should be a small circle or a point since one of the styli may exactly coincide with the turn center 226. If the probe is fixed at an angle different from the first angle as shown by a dotted line of the probe 40 in FIG. 22(b), the contact stylus trajectory should be a larger circle since any one of the styli around the tip 260 is far from the turn center 226. Therefore, the rotation of the probe 40 by the shaft 300 may make a variety of circular locus or trajectory. One example with a certain angle by the shaft 300 is shown in FIG. 22(c). As the turn disk 42 rotates as shown by arrows g22, the tip 260 makes a rather large circular locus or trajectory since the tip 260 is not very close to the turn center 226.

Figure 23:
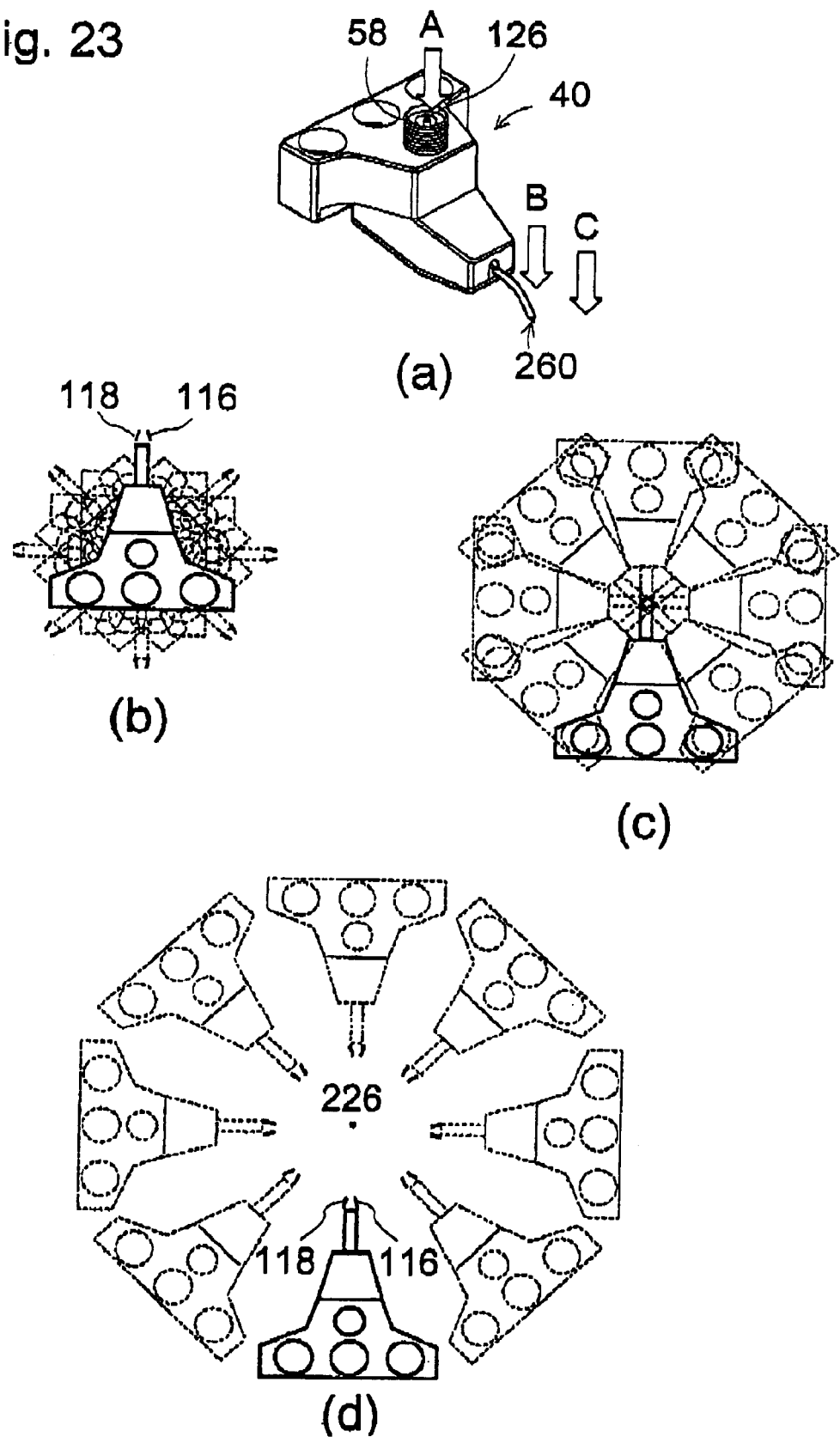
FIG. 23 shows contact stylus trajectories by turning a high frequency probe around a turn center.

FIG. 23 shows how the contact styli 116, 118 at the tip 260 of the probe 40 make circular trajectories as the turn disk 42 turns in order to locate the contact styli coinciding with the measurement points on the printed wiring board 28. In FIG. 23(a), the position of turn center 226 is indicated by each arrow with A, B, or C. By way of example, suppose the probe 40 is mounted at the mounting position 252 on the shift bar 240 as shown in FIG. 19 and the bar 240 is fully shifted toward the center 226 so that the center 226 coincides with the center of the mounting position 252 as shown by the arrow A. The threaded portion 58 is screwed in the position 252 such that the center of the coaxial cable connector 126 coincides with the center of the mounting position 252. The probe 40, therefore, rotates when the turn disk 42 rotates as shown in FIG. 23(b). Two contact styli 116, 118 are positioned apart from the center 226 so that each contact stylus trajectory may make a circle with a diameter in the order of the probe size.

When the tip 260 coincides with the center 226 as shown by the arrow B, each contact stylus trajectory may make a small circle with a small diameter as shown in (c). If either contact stylus coincides exactly with the turn center 226, the other contact stylus turns around the coinciding contact stylus as described later. Such contact stylus arrangement is similar to the coaxial probe arrangement, but it is not limited to the coaxial case.

When the center 226 is located at the position as shown by the arrow C, each contact stylus trajectory may make a rather small circle as shown in (d) although the probe 40 turns along a large circular line. As described above, the probe unit 22 may easily make the contact stylus arrangement match up with a measurement point arrangement on the printed wiring board 28.

Figure 24:
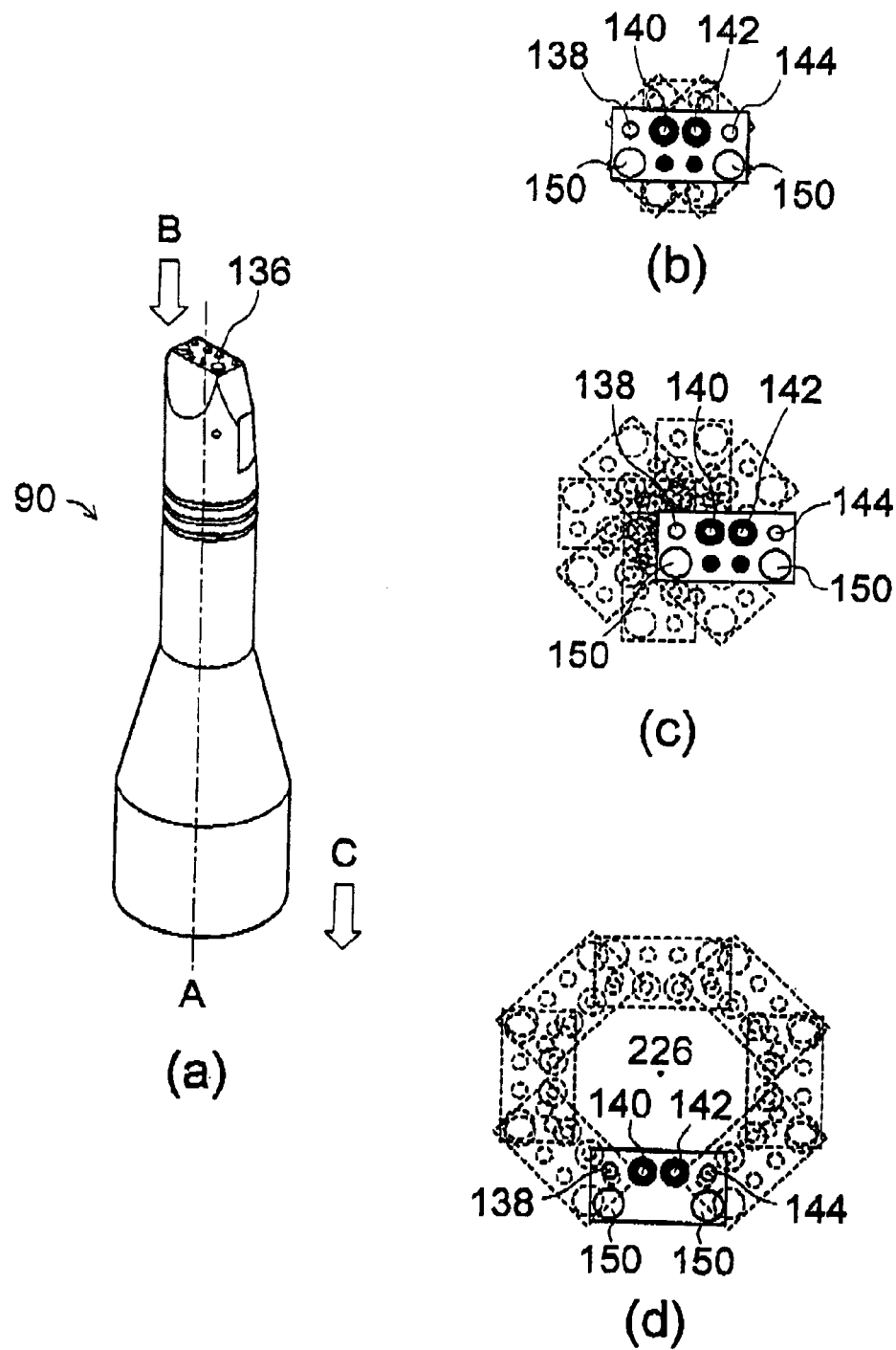
FIG. 24 shows contact stylus trajectories by turning a differential probe around a turn center.

FIG. 24 shows how the contact styli 138, 140, 142, 144 on the top face 136 of the differential probe 90 make circular trajectories as the turn disk 42 turns in order to locate the contact styli coinciding with the measurement points on the printed wiring board 28. In FIG. 24(a), the position of turn center 226 is indicated by each arrow with A, B, or C. By way of example, suppose the probe 90 is mounted at the center of the turn disk 42 in FIG. 3(b). The longitudinal axis of the probe 90 coincides with the turn center 226 so that each contact stylus trajectory makes a small circle as shown in (b). Since no contact stylus is located at the center of the longitudinal axis of the probe 90, no contact stylus coincides exactly with the center 226. Although the probe 90 is not shown in any shift devices mentioned above, it should be understood that the probe 90 may be mounted on any shift device by replacing the high frequency probe 40.

When the center 226 coincides with the arrow B, the contact stylus trajectories may be shown in (c). If one of the contact stylus coincides with the center 226, the other contact styli turn around the coinciding contact stylus. When the center 226 coincides with the arrow C, the contact stylus trajectories may be shown in (d). The contact stylus trajectories make a larger circles since the distance from the center 226 is longer than the other cases.

Figure 25:
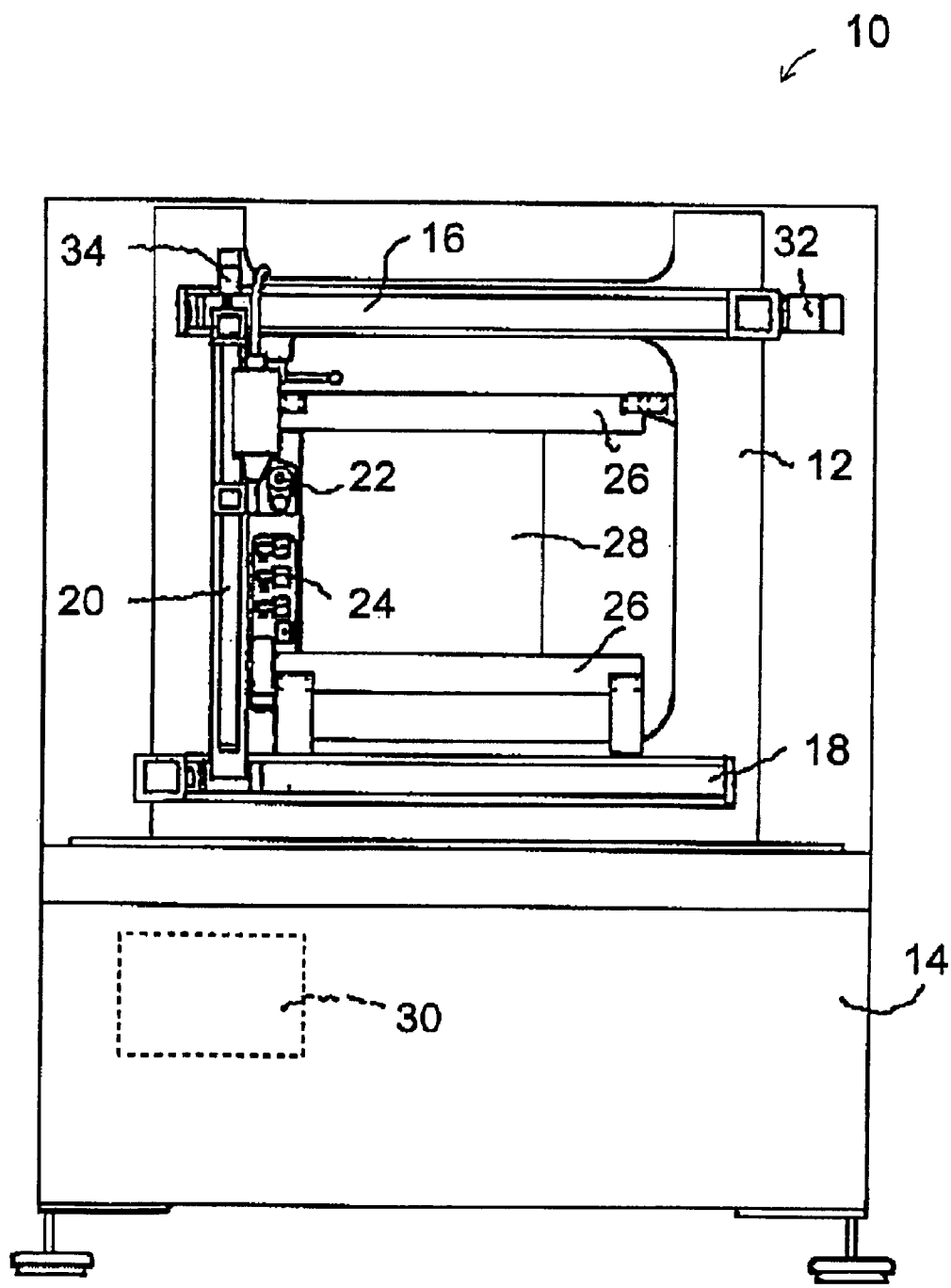
FIG. 25 is a front view that illustrates an outline of an impedance measuring device in accordance with the present invention.

FIG. 25 illustrate another example of an impedance measuring device according to the present invention. Since most configuration is the same as in FIG. 1, the same numerical references are used for most parts and redundant explanation will be omitted.

In the figure a front view of the impedance measuring device 10 with a frame 12 fixed in the body 14 is shown, Near upper and lower parts of the frame 12, X-rails 16 and 18 are horizontally fixed, respectively. A Y-rail 20 is provided such that it can move between the X-rails 16 and 18 in a parallel direction to the X-rails. A probe unit 22 is provided on the Y-rail 20 such that it can move along the longitudinal direction of the Y-rail 20. The X-rails 16 and 18, and Y-rail 20 constitute the test probe driving means. A probe holding unit 24 that holds the coaxial probe. A board holding clamps 26, 26 that grasp the printed wiring board 28 to be measured are fixed on the frame 12. A control unit 30 is provided in the lower part of the in the body 14.

On the X-rail 16, a ball screw (not shown), which is turned by a servomotor 32, is provided along the longitudinal direction. The upper edge of the Y-rail 20 is fixed to the working part of this ball screw. A ball screw, which is not illustrated and is driven to turn by a servomotor 34, is also provided on the Y-rail 20 along the longitudinal direction. The probe unit 22 is fixed to the working part of this ball screw. These servomotors 32 and 34 are controlled by the control unit 30, thereby, the probe unit 22 can be constituted to move to any position in the movable plane between the X-rails 16 and 18.

Figure 26:
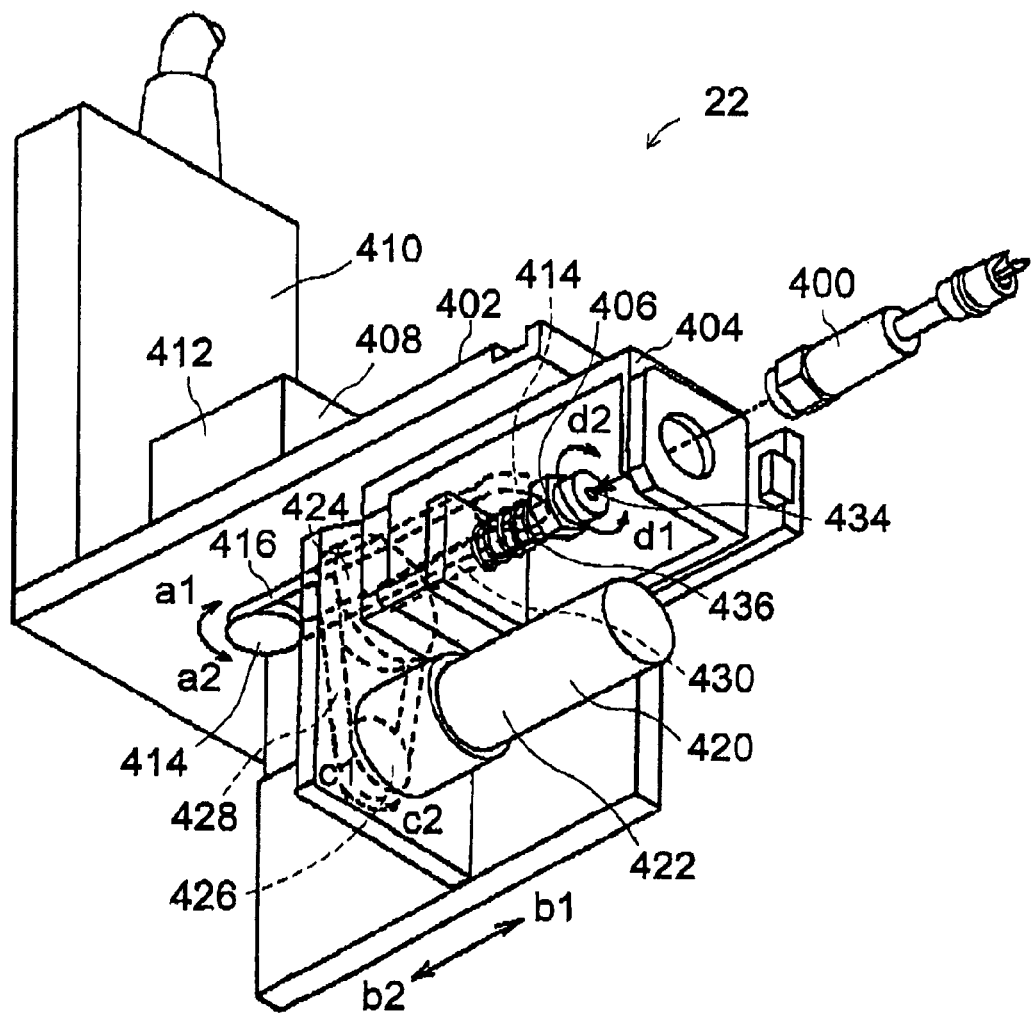
FIG. 26 is an oblique view that illustrates a probe unit used in an impedance measuring device in accordance with the present invention.

FIG. 26 illustrates an oblique view of the probe unit 22. The probe unit 22 mounts (to be used) a coaxial probe 400 which is the test probe. The probe unit 22 is comprised of a base 402 fixed to the working part of the ball screw (not shown) in the Y-rail; a connector holder 404 secured to the base 402 in a manner such that it can slide perpendicularly to the plane that constitutes the printed wiring board 28 which is fixed by board holding clamps 26, 26; a rod-like connector 406 that holds and is electrically connected to a coaxial probe 400 and is secured to a connector holder 404 in such a manner that it can slide in the longitudinal direction; a sliding movement motor unit 408 fixed to the base 402; and a measurement unit 410 that is fixed to the base 402, transmits a measurement signal to the board through the coaxial probe 400 connected to the connector 406, and receives a reflected wave of the transmitted measurement signal.

The sliding movement motor unit 408 is comprised of a stepping motor 412, pulleys 414, 414, which are provided along the sliding direction of the connector holder 404, and a belt 416, which is set between the pulleys 414 and 414. One of the pulleys 414 and 414 is driven to turn by the stepping motor 412, and a part of the belt 416 is fixed to the connector holder 404. Therefore, when the stepping motor 412 turns the pulleys 414, 414 and moves the belt 416 in the direction of arrow (a1–a2), the connector holder 404 secured to the base 402 in such a manner that the connector holder 404 can slide on the base 402 slides to the direction of arrow (b1–b2) in response to the belt movement. As the coaxial probe 400 is mounted to the connector 406, which is provided on the connector holder 404, the stepping motor 412 can move the coaxial probe 400 in a direction perpendicular to the plane that constitutes the board 28 to be tested, which is held by the board holding clamps 26, 26. Thus, the coaxial probe 400 movement can be controlled.

The turning motor unit 420 is comprised of a servomotor 422 that turns around a rotation axis parallel to the longitudinal direction of the connector 406, a pulley 424 that has the common center axis with the connector 406, a pulley 426 that is directly connected to the servomotor 422, and a belt 428 that applies between the pulleys 424 and 426. The main body 430 of the connector 406 is secured to the pulley 424 such that it can slide in the longitudinal direction, but cannot be turned. When the pulley 426 is turned to the direction of arrow (c1–c2) by means of the servomotor 422, the connector 406 secured to the pulley 424 correspondingly to in the direction of arrows (d1–d2). Because the coaxial probe 400 is mounted to the connector, it can be turned and the angle of rotation can be adjusted by controlling the servomotor 422.

The rear edge of the coaxial probe 400 constitutes a male connector as described later. A female connector 434 that engages with the male connector of this coaxial probe 400 is formed at the tip of the connector 406. Furthermore, this female connector 434 is pressed toward the tip direction by the spring 436. When a force from the tip toward the rear is applied to the coaxial probe 400, which is mounted to the connector 406, the main body 430 slides in the direction of the applied force and the spring 436 regulates the movement to mitigate the impact as the main body 430 of the connector 406 is secured such that it can slide in the longitudinal direction. Although it is not shown in the figures, the female connector 434 is electrically connected to the signal input-output terminal of the measurement unit 410. Furthermore, the measurement unit 410 is connected to a computer terminal unit, which is not shown, and the result of such measurement is recorded by this computer terminal unit.

Figure 27:
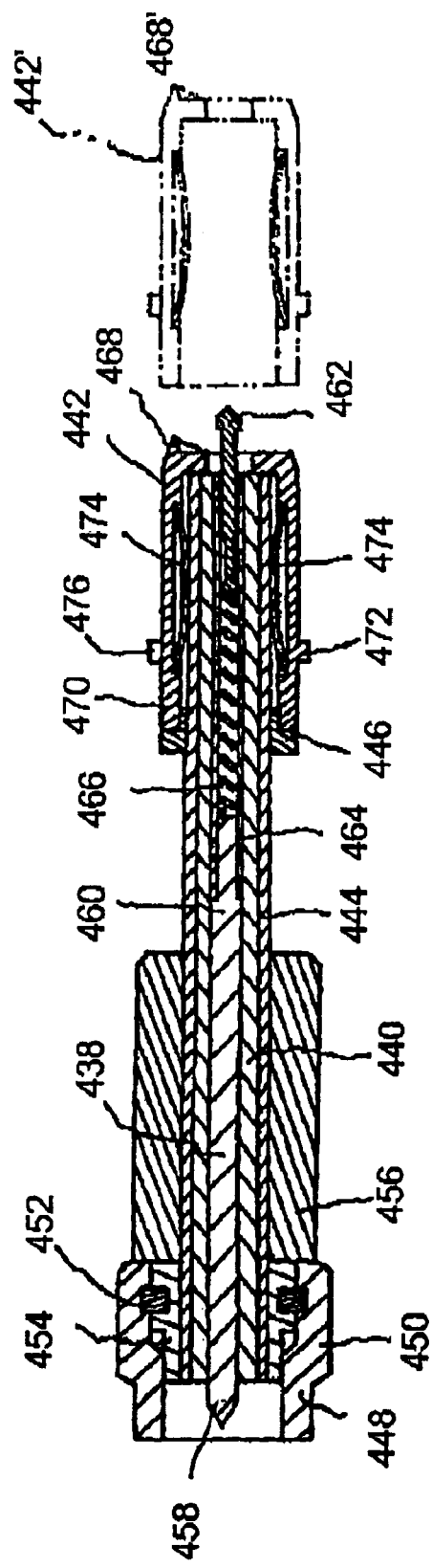
FIG. 27 is a vertical cross-sectional view of a coaxial probe in accordance with the present invention.

Next, the coaxial probe 400 mounted to the probe unit 22 will be explained in detail. FIG. 27 illustrates a vertical cross-sectional view of the coaxial probe 400. In the figure the right edge is the tip of the coaxial probe 400. The coaxial probe 400 is comprised of a rod-like center probe 438, a tube-like insulator 440 formed of an insulating substance that fits around the peripheral face of the center probe 438, an outer tube 444 formed of conductive material that fits around the peripheral face of the insulator 440, a cylindrical plunger 442 that fits around the peripheral face on the tip side of the outer tube 444, a stopper 446 that engages with the opening part at the rear edge of the plunger 442 and fits around the peripheral face of the outer tube 444, a known male connector 448 composed of parts 450, 452 and 454 on the rear edge side that fits around the peripheral face on the rear edge side of the outer tube, and a cylindrical holder 456, which is provided to be in contact with the male connector 448 on its tip end side and fits around the peripheral face of the outer tube 444. The center probe 438 further comprises a terminal 458 that is formed inside the male connector 448 about the rear edge, a rod-like terminal rod 460 whose outer diameter is smaller towards the tip end, a tube-like conductor pipe 438 that has the same outer diameter as the terminal rod 460 and has the rear edge part that fits to the tip part of the terminal rod 460 where the outer diameter is smaller, the first contact stylus 462 with a sharp top tip that is provided inside of the conductor pipe 464 about the tip side such that it can slide, and a compression spring 466 that mitigates the impact from the tip of the first contact stylus 462 and is provided between the tip of the terminal rod 460 and the rear edge of the first contact stylus 462 inside of the conductor pipe 464. As the first contact stylus 462, the conductor pipe 464, and the terminal rod 460 are respectively formed of conductive material, the conductivity from the tip of the first contact stylus 462 to the terminal 458 at the rear edge of the terminal rod 460 is assured.

The plunger 442 is further comprised of a cylindrical main body part 470, the second contact stylus 468 composed of a sharp protrusion which is provided at the edge on the tip side of the main body part 470, a ring-like calibration ring 472 which is provided around the periphery of the main body part, and a plate spring 474 which is provided in the inner peripheral face of the main body part 470 such that it may press the outer peripheral face of said outer tube 444.

Figure 28:
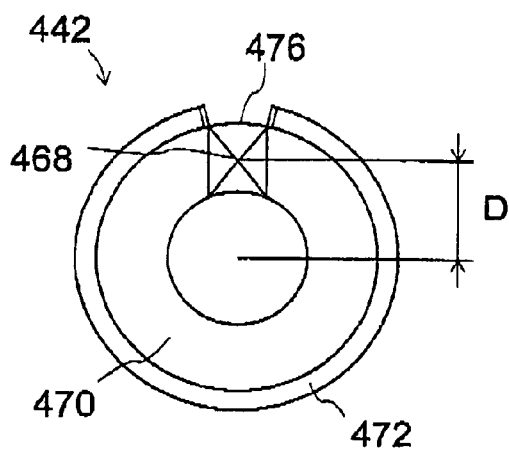
FIG. 28 is a view of a plunger of a coaxial probe observed from a tip direction in accordance with the present invention.
Figure 29:
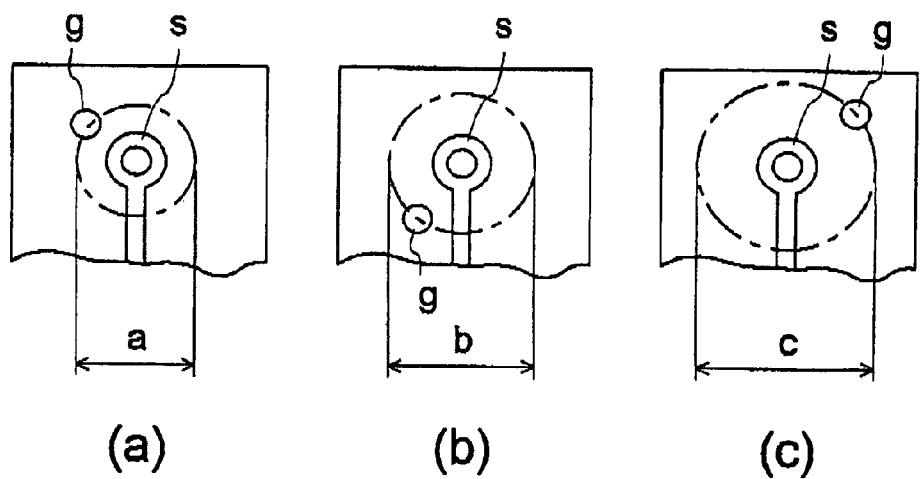
FIGS. 29(a), (b), and (c) illustrates examples of a vicinity of signal wire edges of a printed wiring board to be tested.
Figure 30:
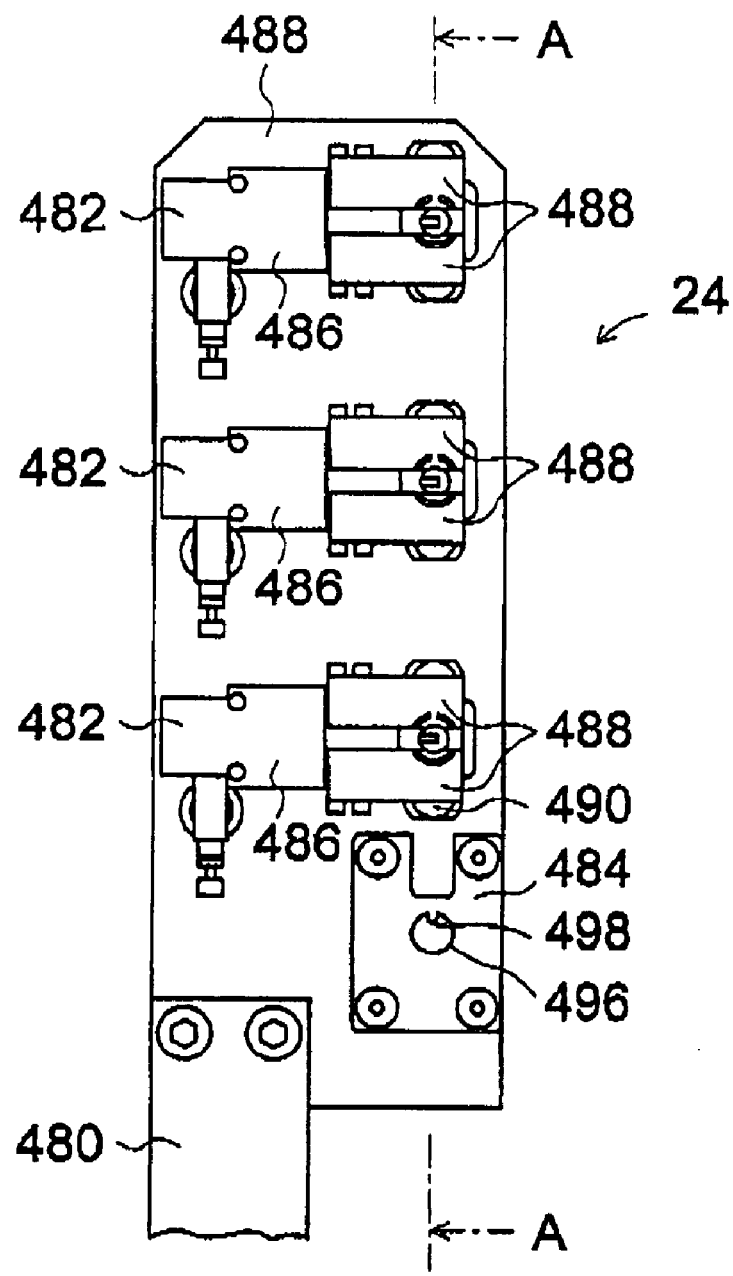
FIG. 30 is a front view of a probe holding unit in accordance with the present invention.
Figure 31:
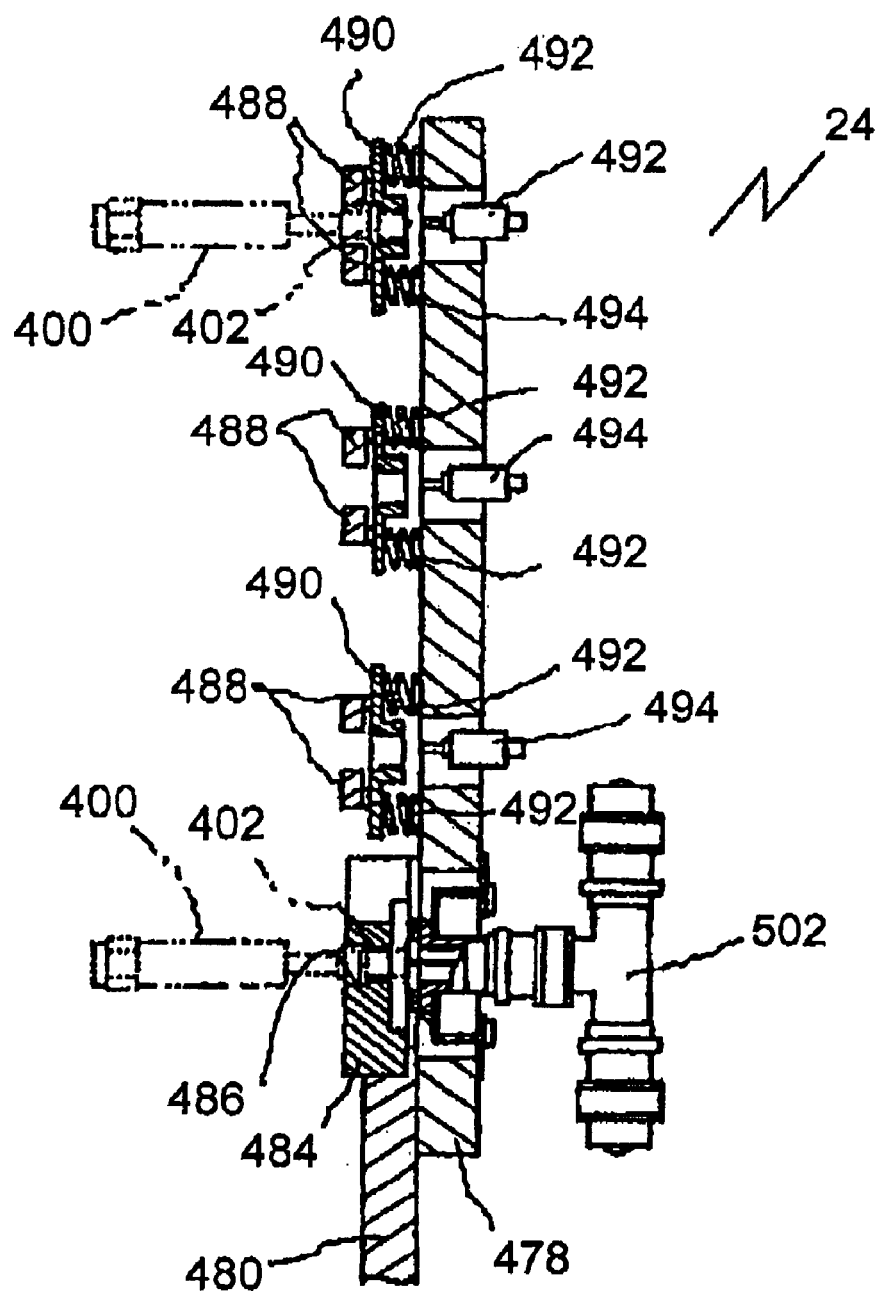
FIG. 31 is a cross-sectional view along A—A in FIG. 30.

FIG. 28 illustrates a view of plunger 442 observed from the tip direction. As illustrated in FIG. 28, a notched part 476 is formed at a part of the calibration ring 472. The notch 476 is formed such that the width will be narrower from the tip toward the rear in the longitudinal direction of the plunger 442. As shown in FIG. 27, the plunger 442 can be attached or detached in the longitudinal direction of the first contact stylus 462 of the center probe 438. The plunger 442, stopper 446, outer tube 444, and male connector 448 are respectively formed of conductive material. When the opening part at the rear edge of the plunger 442 is engaged with the stopper 446, conductivity from the second contact stylus 468 to the male connector 448 is assured. The plunger 442 is formed in this manner so that it can be attached and detached. Thus, the plunger 442 can be replaced with a replacement plunger 442' based on the distance between the edge of signal wire and the through-hole in the board 28 to be tested. FIGS. 29(*a*), (*b*), and (*c*) illustrate examples of the vicinity of the edge of signal wire in the board 28 to be tested. In general there are various distances between the signal wire edge (s) and the through-hole (g) connected to ground. However, the types are mostly fixed. FIGS. 29(*a*), (*b*), and (*c*) respectively illustrate the frequently used positional relationships between the signal wire edge (s) and the through-hole (g). The respective diameters (a), (b), and (e) of the circumference where the through-hole (g) is provided with respective signal wire edge (s) as the center are 1.27 mm, 1.9 mm and 2.54 mm. Therefore, plungers 442 that correspond to these distances may be needed. That is, three types plungers 442 with the distances (D) from the center of the plunger 442 so illustrated in FIG. 28 to the tip of the second contact stylus 468, which are the half of said (a), (b), and (c), i.e., 0.635 mm, 0.95 mm, and 1.27 mm, may be used. Needless to say, the number of plungers 442 to be replaced may be increased at any time depending on the needs, Next, the probe holding unit 24 will be explained in detail. FIG. 30 illustrates a front view of a probe holding unit 24. FIG. 31 illustrates the cross-sectional view along A—A in FIG. 30. The probe holding unit 24 is comprised of a base part 478, a base part fixing plate 480 which fixes the base part 478 to the frame 12, the replacement contact stylus holding parts 482, 482, 482 provided on the base part 478, and a calibration part 484 which is also provided on the base part 478.

Each of the replacement contact stylus holding parts 482 is comprised of an air chuck main body 486 which opens and close by controlling an electromagnetic valve which regulates the compressed air fed from a compressor (not shown), contact stylus grasping parts 488, 488 which are constituted to grasp or release the peripheral face of the plunger 442 of the coaxial probe 400 with this air chuck main body 486 as a driving means, a grasping part support plate 490 which has an opening that can engage with the peripheral face of the plunger 442 and supports the contact stylus grasping parts 488, 488 from the bottom, compression springs 492, 492 provided between the grasping part support plate 490 and the base part 478, and a micro-switch 494 which is fixed to the base part 478 and is turned on when the compression springs 492, 492 are compressed as much as a predetermined amount on receipt of the force from the plunger 442, while the plunger 442 engages with the grasping part support plate 490. The air chuck main body 486 switches the electromagnetic valve each time the micro-switch 494 is turned on, thereby alternately repeating the grasping and releasing of the contact stylus grasping parts 488, 488. Although the air chuck main body 486 that uses the compressed air is used here as the driving means, a driving means that operates on electric power such as a solenoid may be used.

The calibration part 484 is comprised of a reference engaging part 496 and a reference resistance 502. The reference engaging part 496 has an opening that engages with the peripheral face of the plunger 442 including the calibration ring 472 that has a notch 476 provided in the periphery of the plunger 442 when the plunger 442 of the coaxial probe 400 is at a predetermined reference position. As the notch 476 of said calibration ring 472 is formed such that its width becomes narrower from the tip toward the rear edge in the longitudinal direction of the plunger, convex part 498 is provided at a predetermined reference position in the reference engaging part 496 in a manner that its width becomes wider from the front to the back face so that the convex part 498 may fit the notch 476. As the notch 476 of the calibration ring 472 is tapered in this manner, the convex part 498 fits snugly into the notch 476 when the coaxial probe 400 is pushed toward the reference engaging part 496 with the installation position in the turning direction around the first contact stylus as the central axis set in the vicinity of the reference position. If the coaxial probe 400 is further pushed forward, the plunger 442 may turn such that the notch 500 come to engage with the convex part 498 completely. Thus, the calibration of the plunger installation position in the turning direction is made. The reference resistance 502 is a resistance that has a reference impedance value. When the plunger 442 of the coaxial probe 400 engages with the reference engaging part 496, it is connected such that the impedance can be measured by means of the first contact stylus 462 and the second contact stylus 468 of the coaxial probe 400. Here, by way of example, 28 ohm is used as the reference impedance value. Finally, the control unit 30 will be briefly explained. The control unit 30 is comprised of a driving unit to drive all motors of the impedance measuring device 10 and a general computer composed of CPU, RAM, ROM and so on which controls the measurement timing of the measurement unit 410 provided in this driving unit and the probe unit 22. The control unit 30 can control the coaxial probe 400 mounted to the probe unit 22 at any position including the axial rotation direction (or angle) by controlling the motors provided in the X-direction rails 16, 18, Y-rail 20, and probe unit 22. Also, the control unit 30 commands the measurement unit 410 to conduct a measurement when the first test probe and the second test probe of the coaxial probe 400 are in contact with the points of measurement on the board 28 to be tested. Then, as the control unit 30 stores the circuit pattern data of the board 28 to be tested, the control unit 30 controls each motor and measurement unit to test the measurement points on the board to be tested based on a predetermined algorithm.

Next, the operation of the impedance measuring device 10 that has the constitution mentioned above will be explained. It is assumed that the printed wiring board 28 to be measured has all patterns with respect to the distance between the signal wire edges and the through-hole as shown in FIGS. 29(*a*), (*b*), and (*c*). It is also assumed that the control unit 30 has already stored the circuit pattern data of the board 28 to be tested. First, the coaxial probe 400 is connected to the connector 406 of the probe unit 22. Also the replacement plungers 442', except for the plunger 442 of the connected coaxial probe 400, are held by the replacement contact stylus holding part 482 of the probe holding unit 24. Since three types of plungers 442 are used in this application mode, two replacement plungers 442' are held by the replacement contact stylus holding part 482. To let the replacement contact stylus holding part 482 hold a plunger 442 the replacement plunger 442' having a replacement second contact stylus 468' is positioned for engagement and pushed in the grasping part support plate 490. In this manner the micro-switch 494 is turned on and the contact stylus grasping parts 488, 488 automatically closes to grasp the replacement plunger 442. Now, the control unit 30 needs to have stored the information in which position each plunger 442 is located, the coaxial probe 400 or the replacement contact stylus holding pans 482, 482, 482. This information may be predetermined or input to the control unit 30 after each plunger 442 is set. Next, the board holding clamps 26, 26 grasp the board 28 to be tested and the measurement is started. The control unit 30 first moves the coaxial probe 400 to the place where the calibration part 484 of the probe holding unit 24 is and has the plunger 442 of the coaxial probe 400 engage the reference engaging part 496 of the calibration part 484. In this manner, the turning direction position of the plunger 442 around the first contact stylus 462 as the center of turning is calibrated. Since the first contact stylus 462 and the second contact stylus 468 of the coaxial probe 400 is able to measure the reference resistance 502 at this time, the control unit 30 transmits the test signal to the measurement unit 410 and receive the reflected waves. If the setting is correct, no reflected wave will return. Therefore, if there are any reflected waves, the setting of the measurement unit 410 should be adjusted based on the magnitude of the reflected waves.

After that, the measurement of the board 28 to be tested is started. The control unit 30 moves the coaxial probe 400 to the point of measurement at which a measurement can be made with the plunger 442 installed on the coaxial probe 400. Then, it controls the turning motor unit 420 of the probe unit 22 to turn the coaxial probe 400 such that the angle made by the first contact stylus 462 and the second contact stylus 468 of the coaxial probe 400 matches the angle made by the signal wire edge and the through-hole at the point of measurement. The amount of turning is pre-computed based on the circuit data. When the control of rotational movement is completed, the control unit 30 controls the sliding motor unit 408 of the probe unit 22, move the coaxial probe 400 by a predetermined amount toward the tip direction and press the tip to the point of measurement. At this time the compression spring 466 provided in the center probe 438 absorbs the impact shock when the first contact stylus 462 hits the board 28 to be tested. When the first contact stylus 462 of the coaxial probe is in contact with the signal line edge and the second contact stylus is in contact with the through-hole, the control unit 30 has the measurement unit 410 measure the impedance of the signal wire in contact. When the measurement is completed, the control unit 30 moves back the tip of the coaxial probe 400 from the board to be tested 28 and returns it to its initial position. Furthermore, it also returns the rotational position of the coaxial probe 400 to its initial position. In this manner, the points of measurement that can be measured with the current plunger 442 mounted to the coaxial probe 400 are measured.

When all measurements that can be measured with the current plunger 442 mounted to the coaxial probe 400 are completed, the control unit 30 moves the coaxial probe 400 to the front of the empty replacement contact stylus holding part 482 of the probe holding unit 24. In this state the control unit 30 has control to move the coaxial probe 400 toward the tip direction. Then, the plunger 442 located around the tip of the coaxial probe 400 is engaged with the grasping part support plate 490 of the replacement contact stylus holding part 482 and the micro-switch 494 is turned on. In this manner, as the electromagnetic valve of the air chuck main body 486 changes over, the contact stylus grasping part 488 closes so that the plunger 442 is grasped. After moving the coaxial probe 400 to a point where the micro-switch 494 is turned on, the control unit 30 then moves the coaxial probe in the reverse direction. At this time, as the plunger 442 is grasped by the contact stylus grasping part 488, the plunger 442 is detached from the coaxial probe 400 main unit and remains in the replacement contact stylus holding part 482.

Then, the control unit 30 moves the coaxial probe 400 without the plunger 442 to the front of the replacement contact stylus holding part 482 where a replacement plunger 442 is held and then moves the coaxial probe 400 toward the tip direction. In this manner, the replacement plunger 442' fits to the outer tube 444 of the coaxial probe 400 where the original plunger 442 used to be put on and then the stopper 446 of the coaxial probe 400 engages with the rear edge opening of the replacement plunger 442'. When the coaxial probe 400 moves further toward the tip direction, the micro-switch 494 is turned on to make the air chuck main body 486 open and to make the contact stylus grasping parts 488, 488 release the replacement plunger 442'. After the control unit 30 moves the coaxial probe to the position where the micro-switch is turned on, it moves the coaxial probe 400 back in the reverse direction to its initial position. At this time, as the grasping of replacement plunger 442' is released, a new plunger 442 is mounted on the coaxial probe 400. Thus, the replacement of plungers 442 is completed. In this manner, the plunger 442, that is, the contact stylus replacement means to replace the second contact stylus 468 is composed of the means to drive the coaxial probe such as X-rails 16, 18 and the Y-rail 20, the contact stylus grasping parts 488, 488, the air chuck main body 486 as the driving means that drives these contact stylus grasping parts 488, 488, the control unit 30 that controls the driving of the coaxial probe and the micro-switch 494 that controls the air chuck main body 486.

When the replacement of plunger 442 is completed, the control unit 30, in the same way as mentioned earlier, has the calibration part 484 of the probe holding unit 24 calibrate the plunger turning direction position around the first contact stylus 462 as the center of turning and the measurement unit 410. After that, it measures the points of measurement on the board 28 to be tested that can be measured with the replaced plunger 442. The replacement to the remaining last replacement plunger 442' is further made in the same way as described above. After the calibration of rotational positions etc., the points of measurement on the board 28 to be tested that can be measured with the last plunger 442 are measured. By the operation described above, the impedance of all measurement points is measured.

In this manner, although the board to be tested has more than one kind of distance between the two points for impedance measurement and even though radial or turning direction relation between the two points is varied in many ways, the impedance measurement may be conducted and completed with the impedance measuring device in accordance with the present invention by replacing and turning the second contact stylus around the first contact stylus. Therefore, it is realized that the impedance measurement can be automated with the impedance measuring device in accordance with the present invention.

In said application mode, the second contact stylus 468 is turned around the first contact stylus 462 by turning the entire coaxial probe 400. However, instead of this, for instance, a servomotor for control may be provided on the coaxial probe 400, and only the plunger 442 that contains the second contact stylus 468 may be turned.

Furthermore, it is not needed to provide a mechanism to turn the second contact stylus 468 in the probe unit 22. For instance, the probe unit, therefore may has a mechanism that engages with and turn the plunger 442 so including the second contact stylus 468 so that the control unit 30 may move the coaxial probe 400 to this mechanism part to have the plunger 442 engaged with and turned by the mechanism when the rotation is needed for a necessary amount of turning.

Also, in this application mode, the plunger 442 is made attachable and detachable so that only the plunger 442 should be replaced. However, the plunger 442 may be fixed to the coaxial probe 400 and the whole coaxial probe 400 including the plunger 442 may be replaced. That is, as long as the second contact stylus 468 is structurally connected, the range or the size of the part to be replaced is not limited.

Then, in the application mode, the coaxial probe is used for the test probe unit. Any test probe units using a probe other than the coaxial probe may also be used. For instance, the invention may also be applied to a test probe unit which has the conductor leading from the first contact stylus to the signal transmission and reception part of the measurement unit and the conductor leading from the second contact stylus to the ground part of the measurement unit in parallel or twisted relation, as long as the first contact stylus and the second contact stylus are fixed with a certain distance apart during impedance measurement.

What is claimed is:

1. A probe unit for measuring impedance for a printed wiring board, comprising:
    a probe having a first and a second contact styli to be contacted with a first and a second predetermined points on the printed wiring board, the styli being fixed to the probe with a resilient member;
    a turn disk having a turn center and a first position on a board-side face of the turn disk, the turn disk being formed to receive the probe at the first position;
    a turn device for turning the turn disk around the turn center such that the probe turns so that the contact styli turn substantially parallel to a measurement face of the printed wiring board; and
    a moving device for moving the probe toward the measurement face of the printed wiring board such that the first and second contact styli are contacted with the predetermined points;
    wherein the turn disk has a second position at which the probe can be disposed by being shifted from the first position;
    wherein the first position is farther from the turn center than the second position such that the probe is turned with a larger radius of curvature at the first position;
    wherein the turn disk and the turn device are moved together by the moving device; and
    wherein the turn device comprises:
        a motor causing a turning driving force;
        a belt transmitting the turning driving force;
        a pulley being connected to the turn disk and receiving the turning driving force from the belt such that the turn disk can be turned around the turn center; and
        a turn main body supporting the pulley rotatably with a bearing.

2. The probe unit according to claim 1,
    wherein the moving device comprises:
        a second motor causing a second turning driving force;
        a second belt transmitting the second turning driving force;
        a ball screw having a second pulley receiving the second turning driving force from the second belt; and
        a mount member on which the turn main body is mounted.

3. A probe unit for measuring impedance for a printed wiring board, comprising:
    a probe having a connecting portion and a first and a second contact styli to be contacted with a first and a second predetermined points on the printed wiring board;
    a turn disk having a turn center and a mounting position, on which the probe is mounted with the connecting portion being fixed to the mounting position at a first angle relative to the turn disk;
    a turn device for turning the turn disk around the turn center such that the probe turns so that the contact styli turn substantially parallel to a measurement face of the printed wiring board; and
    a moving device for moving the probe toward the measurement face of the printed wiring board such that the first and second contact styli are contacted with the predetermined points;

wherein the probe can be mounted on the mounting position such that the connecting portion is fixed to the mounting position at a second angle relative to the turn disk;

wherein at least one distance between the turn center and one of the styli is changed by fixing the connecting portion of the probe at the second angle;

wherein the turn disk comprises a spinning device turning the probe from the first angle to the second angle in a substantially continuous manner; and wherein the spinning device comprises:
  a pivot axis of the connecting portion; around which the probe is turned;
  a probe spinning device for turning the probe around the pivot axis; and
  a lock notch securing a turning position of the probe.

4. A probe unit for measuring impedance for a printed wiring board, comprising:
  a probe having a connecting portion and a first and a second contact styli to be contacted with a first and a second predetermined points on the printed wiring board;
  a turn disk having a turn center and a mounting position, on which the probe is mounted with the connecting portion being fixed to the mounting position at a first angle relative to the turn disk;
  a turn device for turning the turn disk around the turn center such that the probe turns so that the contact styli turn substantially parallel to a measurement face of the printed wiring board; and
  a moving device for moving the probe toward the measurement face of the printed wiring board such that the first and second contact styli are contacted with the predetermined points;
  wherein the probe can be mounted on the mounting position such that the connecting portion is fixed to the mounting position at a second angle relative to the turn disk;
  wherein at least one distance between the turn center and one of the styli is changed by fixing the connecting portion of the probe at the second angle;
  wherein the turn disk and the turn device are moved together by the moving device; and
  wherein the turn device comprises:
    a motor causing a turning driving force;
    a belt transmitting the turning driving force;
    a pulley being connected to the turn disk and receiving the turning driving force from the belt such that the turn disk can be turned around the turn center; and
    a turn main body supporting the pulley rotatably with a bearing.

5. The probe unit according to claim 4,
wherein the moving device comprises:
  a second motor causing a second turning driving force;
  a second belt transmitting the second turning driving force;
  a ball screw having a second pulley receiving the second turning driving force from the second belt; and
  a mount member on which the turn main body is mounted.

6. A probe unit for measuring impedance for a printed wiring board, comprising:
  a probe having a connecting portion and a first and a second contact styli to be contacted with a first and a second predetermined points on the printed wiring board;
  a turn disk having a turn center and a mounting position, on which the probe is mounted with the connecting portion being fixed to the mounting position at a first angle relative to the turn disk;
  a turn device for turning the turn disk around the turn center such that the probe turns so that the contact styli turn substantially parallel to a measurement face of the printed wiring board; and
  a moving device for moving the probe toward the measurement face of the printed wiring board such that the first and second contact styli are contacted with the predetermined points;
  wherein the probe can be mounted on the mounting position such that the connecting portion is fixed to the mounting position at a second angle relative to the turn disk;
  wherein at least one distance between the turn center and one of the styli is changed by fixing the connecting portion of the probe at the second angle;
  wherein the turn disk comprises a spinning device turning the probe from the first angle to the second angle in a substantially continuous manner; and
  wherein the spinning device comprises:
    a pivot axis of the connecting portion, around which the probe is turned;
    a probe spinning device for turning the probe around the pivot axis; and
    a lock notch securing a turning position of the probe; and wherein the control unit integrally controls the probe spinning device.

* * * * *